US010594100B1

(12) United States Patent
Namihisa et al.

(10) Patent No.: US 10,594,100 B1
(45) Date of Patent: Mar. 17, 2020

(54) FLEXIBLE TYPE ELECTRICAL FEED-THROUGH CONNECTOR ASSEMBLY

(71) Applicant: Western Digital Technologies, Inc., San Jose, CA (US)

(72) Inventors: Miki Namihisa, Fujisawa (JP); Kimihiko Sudo, Yokohama (JP); Hiromitsu Masuda, Odawara (JP); Nobumasa Nishiyama, Yokohama (JP); Satoshi Nakamura, Yokohama (JP); Hiroshi Matsuda, Yokohama (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/231,493

(22) Filed: Dec. 22, 2018

Related U.S. Application Data

(63) Continuation-in-part of application No. 16/005,648, filed on Jun. 11, 2018.
(Continued)

(51) Int. Cl.
*G11B 33/14* (2006.01)
*H01R 31/06* (2006.01)
(Continued)

(52) U.S. Cl.
CPC ............ *H01R 31/06* (2013.01); *G11B 5/4826* (2013.01); *G11B 33/14* (2013.01); *H01R 12/78* (2013.01); *H01R 12/79* (2013.01); *H01R 12/91* (2013.01); *H01R 13/74* (2013.01); *H01R 43/205* (2013.01); *H05K 1/028* (2013.01); *H05K 1/118* (2013.01);
(Continued)

(58) Field of Classification Search
None
See application file for complete search history.

(56) References Cited

U.S. PATENT DOCUMENTS 4,571,651 A * 2/1986 Reid ...................... G11B 5/105
29/603.05
5,276,572 A 1/1994 Kinoshita et al.
(Continued)

FOREIGN PATENT DOCUMENTS

EP 0844899 B1 7/2003
JP 2006127814 A 5/2006
(Continued)

*Primary Examiner* — William J Klimowicz
(74) *Attorney, Agent, or Firm* — John D. Henkhaus

(57) ABSTRACT

A flexible type electrical feed-through involves a flexible printed circuit (FPC) part constructed as a laminate structure of a base insulating layer, a conductor layer, and a cover insulating layer, where the FPC part is wrapped around a metal part, forming a connector assembly. Such a feed-through may be used at an interface between a hermetically-sealed internal environment, such as in a lighter-than-air gas filled data storage device, and the external environment. Multiple connector parts may be coupled to an inner side of the feed-through, to each mate with a respective flexible cable assembly electrically connected to a respective actuator of a multi-actuator hard disk drive. A floating board-to-board connector part may be coupled to the outer side of the feed-through, which in turn is electrically connected to a printed circuit board assembly of a hard disk drive, and which is able to tolerate connector mating misalignment.

21 Claims, 16 Drawing Sheets

Related U.S. Application Data

(60) Provisional application No. 62/730,258, filed on Sep. 12, 2018, provisional application No. 62/730,271, filed on Sep. 12, 2018.

(51) Int. Cl.

| | | |
|---|---|---|
| *H05K 1/11* | (2006.01) | |
| *H05K 1/02* | (2006.01) | |
| *H05K 1/18* | (2006.01) | |
| *H01R 13/74* | (2006.01) | |
| *H01R 43/20* | (2006.01) | |
| *H01R 12/79* | (2011.01) | |
| *H01R 12/78* | (2011.01) | |
| *G11B 5/48* | (2006.01) | |
| *H01R 12/91* | (2011.01) | |
| *H01R 12/77* | (2011.01) | |

(52) U.S. Cl.
CPC ........... *H05K 1/181* (2013.01); *H01R 12/778* (2013.01); *H05K 2201/056* (2013.01); *H05K 2201/09445* (2013.01); *H05K 2201/10189* (2013.01); *H05K 2201/10507* (2013.01)

(56) References Cited

U.S. PATENT DOCUMENTS

| | | | |
|---|---|---|---|
| 5,454,157 A * | 10/1995 | Ananth | G11B 33/121 29/467 |
| 5,508,860 A | 4/1996 | Takagi et al. | |
| 5,760,997 A | 6/1998 | Koyanagi et al. | |
| 5,966,267 A * | 10/1999 | Hooley | G11B 25/043 360/99.16 |
| 6,016,000 A | 1/2000 | Moslehi | |
| 6,057,982 A * | 5/2000 | Kloeppel | G11B 25/043 360/99.25 |
| 6,129,579 A * | 10/2000 | Cox | G11B 5/4846 360/99.18 |
| 6,168,459 B1 * | 1/2001 | Cox | G11B 5/4846 360/99.18 |
| 6,970,322 B2 | 11/2005 | Bernett | |
| 6,989,493 B2 | 1/2006 | Hipwell, Jr. et al. | |
| 7,019,942 B2 | 3/2006 | Gunderson et al. | |
| 7,599,147 B2 * | 10/2009 | Gunderson | H05K 5/069 360/97.22 |
| 7,874,846 B2 * | 1/2011 | Gunderson | G11B 33/122 174/262 |
| 8,035,923 B2 | 10/2011 | Suzuki et al. | |
| 8,098,454 B2 | 1/2012 | Kouno et al. | |
| 8,194,348 B2 | 6/2012 | Jacoby et al. | |
| 8,487,187 B2 * | 7/2013 | VandenEynden | H01B 17/30 174/152 GM |
| 8,593,760 B2 | 11/2013 | McGuire, Jr. | |
| 9,472,242 B1 | 10/2016 | Le et al. | |
| 9,490,620 B1 | 11/2016 | Albrecht et al. | |
| 9,558,790 B1 | 1/2017 | Onobu et al. | |
| 9,672,870 B1 | 6/2017 | Mizumoto et al. | |
| 9,721,619 B2 * | 8/2017 | Sudo | G11B 25/043 |
| 9,734,874 B1 * | 8/2017 | Choe | G11B 33/1466 |
| 10,162,393 B2 * | 12/2018 | Fruge | G06F 1/187 |
| 2003/0227711 A1 | 12/2003 | Macpherson | |
| 2004/0057589 A1 | 3/2004 | Pedersen et al. | |
| 2004/0183183 A1 | 9/2004 | Cady et al. | |
| 2004/0228039 A1 * | 11/2004 | Wu | G11B 5/4846 360/264.2 |
| 2004/0257698 A1 | 12/2004 | Bernett | |
| 2006/0050429 A1 * | 3/2006 | Gunderson | G11B 25/043 360/99.21 |
| 2008/0144273 A1 * | 6/2008 | Mewes | G11B 33/121 361/679.37 |
| 2008/0316641 A1 * | 12/2008 | Gunderson | G11B 33/1466 360/97.22 |
| 2009/0068897 A1 * | 3/2009 | Jin | H01R 12/57 439/637 |
| 2011/0211279 A1 * | 9/2011 | Jacoby | G11B 25/043 360/99.21 |
| 2015/0139770 A1 | 5/2015 | Moura et al. | |
| 2017/0169860 A1 | 6/2017 | Sudo et al. | |
| 2017/0294737 A1 * | 10/2017 | Horchler | H01R 12/716 |
| 2017/0352386 A1 | 12/2017 | Kaneko et al. | |
| 2019/0074615 A1 * | 3/2019 | Okamoto | G11B 23/00 |

FOREIGN PATENT DOCUMENTS

| | | | | |
|---|---|---|---|---|
| JP | 2009004064 A * | 1/2009 | ......... | G11B 33/1466 |
| JP | 2009004064 A | 1/2009 | | |

\* cited by examiner

FORM A LAMINATE FLEXIBLE CABLE ASSEMBLY (FCA) COMPRISING A BASE INSULATING LAYER, A CONDUCTOR LAYER OVER THE INSULATING LAYER, AND A COVER INSULATING LAYER OVER THE CONDUCTOR LAYER, WHEREIN THE CONDUCTOR LAYER COMPRISES A PLURALITY OF ELECTRICAL CONNECTION PADS AND ELECTRICAL CONDUCTORS CONNECTING PAIRS OF THE PADS
1202

FOLD THE FCA AT LEAST IN PART AROUND A METAL PLATE
1204

ADHERE THE FCA TO THE METAL PLATE, FORMING A CONNECTOR ASSEMBLY COMPRISING FIRST PADS OF THE PAIRS ON AN UPPER SIDE OF THE CONNECTOR ASSEMBLY ELECTRICALLY CONNECTED VIA THE CONDUCTORS TO SECOND PADS OF THE PAIRS ON THE LOWER SIDE OF THE CONNECTOR ASSEMBLY
1206

FIG. 12

PROVIDE ELECTRICAL TRANSMISSION MEANS FOR TRANSMITTING ELECTRICAL SIGNALS THROUGH AN INTERFACE BETWEEN A HERMETICALLY-SEALED INTERNAL ENVIRONMENT OF AN ELECTRONIC COMPONENT AND AN EXTERNAL ENVIRONMENT
1302

PROVIDE MEANS FOR MATING A METAL PORTION OF THE ELECTRICAL TRANSMISSION MEANS WITH A METAL PORTION OF A BASE OF THE ELECTRONIC COMPONENT
1304

PROVIDE HERMETICALLY-SEALING MEANS FOR BONDING THE METAL PORTION OF THE ELECTRICAL TRANSMISSION MEANS WITH THE METAL PORTION OF THE BASE
1306

FIG. 13

FLEXIBLE TYPE ELECTRICAL FEED-THROUGH CONNECTOR ASSEMBLY

CROSS-REFERENCE TO RELATED APPLICATIONS

This application is a continuation-in-part of and claims the benefit of priority to pending U.S. patent application Ser. No. 16/005,648 filed on Jun. 11, 2018, entitled "Flexible Type Electrical Feed-Through", the entire content of which is incorporated by reference for all purposes as if fully set forth herein.

This application claims the benefit of priority to U.S. Provisional Patent Application Ser. No. 62/730,258, entitled "Helium Seal Connector" filed Sep. 12, 2018, the entire content of which is incorporated by reference for all purposes as if fully set forth herein.

This application claims the benefit of priority to U.S. Provisional Patent Application Ser. No. 62/730,271, entitled "Flexible Helium Seal Connector" filed Sep. 12, 2018, the entire content of which is incorporated by reference for all purposes as if fully set forth herein.

FIELD OF EMBODIMENTS

Embodiments of the invention may relate generally to a hermetically sealed data storage device and particularly to controlling gas leakage through an electrical feed-through connector assembly.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. Hence, operating an HDD in helium reduces the drag force acting on the spinning disk stack, and the mechanical power used by the disk spindle motor is substantially reduced. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDD is also increased due to low humidity, less sensitivity to altitude and external pressure variations, and the absence of corrosive gases or contaminants.

Electronic systems that require hermetically sealed internal volume (e.g., a lighter-than-air gas filled, sealed HDD or system of HDDs) need a way of connecting electrical lines through the enclosure. This is typically accomplished with a hermetic electrical connector, or electrical "feed-through". One possible approach may involve the use of a low permeability but relatively expensive feed-through, such as glass-metal feed-through. Another approach may involve the use of a low-cost printed circuit board (PCB) feed-through, but these typically have a higher leak rate.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 12 is a flow diagram illustrating a method of manufacturing an electrical feed-through component, according to an embodiment;

FIG. 13 is a flow diagram illustrating a method of sealing an interface between a hermetically-sealed internal environment and an external environment, according to an embodiment;

DETAILED DESCRIPTION

Approaches to a sealed electrical feed-through connector assembly are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of an electrical feed-through for a digital storage device (DSD), such as a hard disk drive (HDD), and in the context of a system of multiple DSDs/HDDs. Thus, in accordance with an embodiment, a plan view illustrating an HDD 100 is shown in FIG. 1 to illustrate an exemplary operating context.

Figure 1:
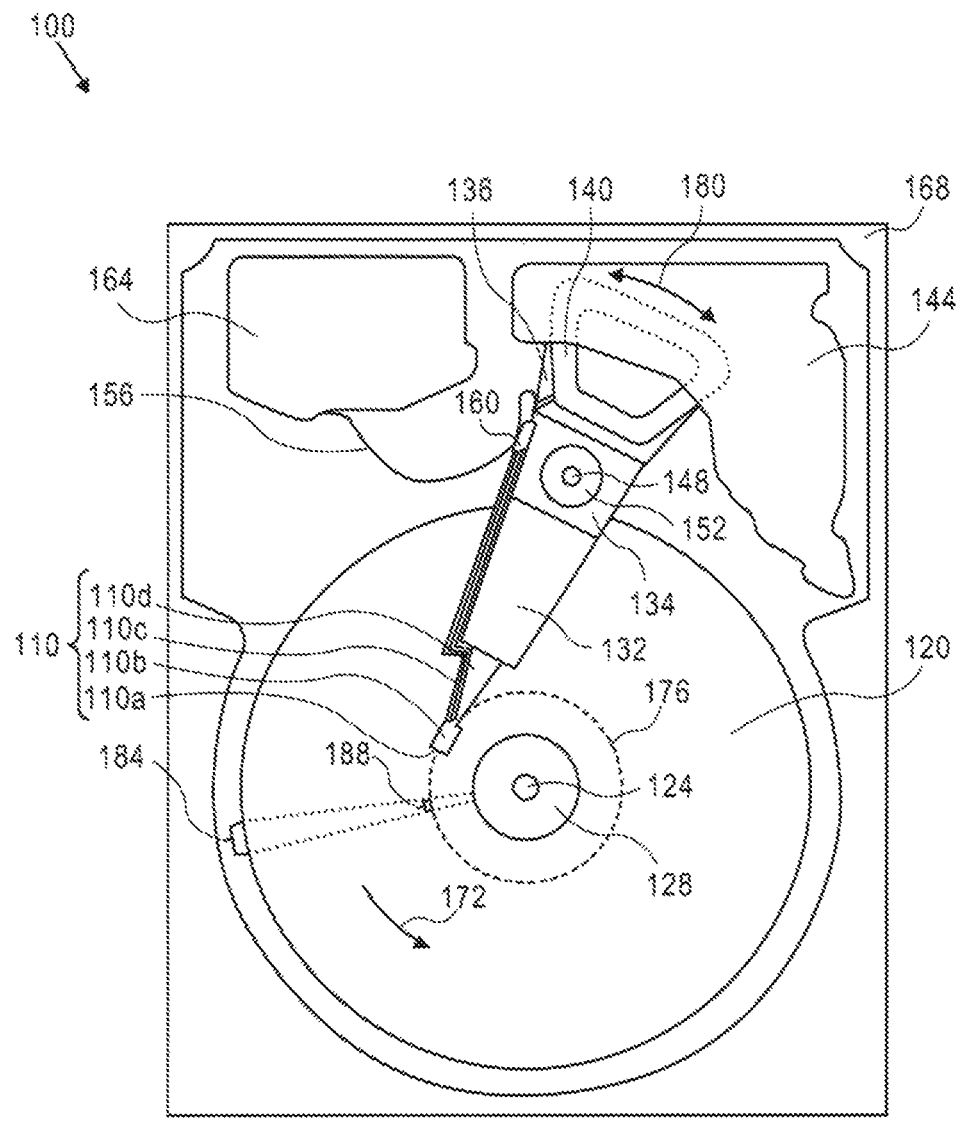
FIG. 1 is a plan view illustrating a hard disk drive (HDD), according to an embodiment.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM, and a write signal to and a read signal from the head 110a) are transmitted by a flexible cable assembly (FCA) 156 (or "flex cable"), also at times referred to as a flexible printed circuit (FPC). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110*b* rides.

The electrical signal provided to the voice coil 140 of the VCM enables the head 110*a* of the HGA 110 to access a track 176 on which information is recorded. Thus, the armature 136 of the VCM swings through an arc 180, which enables the head 110*a* of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110*a* of the HGA 110 reads the servo-burst-signal pattern, which provides a position-error-signal (PES) to the servo electronics, which controls the electrical signal provided to the voice coil 140 of the VCM, thereby enabling the head 110*a* to follow the track 176. Upon finding the track 176 and identifying a particular sectored track portion 188, the head 110*a* either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "hermetic" will be understood to describe a sealing arrangement designed to have nominally no (or negligible) gaseous leakage or permeation paths. While terms such as "hermetic", "hermetically-sealed", "negligible leakage", "no leakage", etc. may be used herein, note that such a system would often still have a certain amount of permeability and, therefore, not be absolutely leak-free. Hence, the concept of a desired or target "leak rate" may be used herein.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Figure 2:
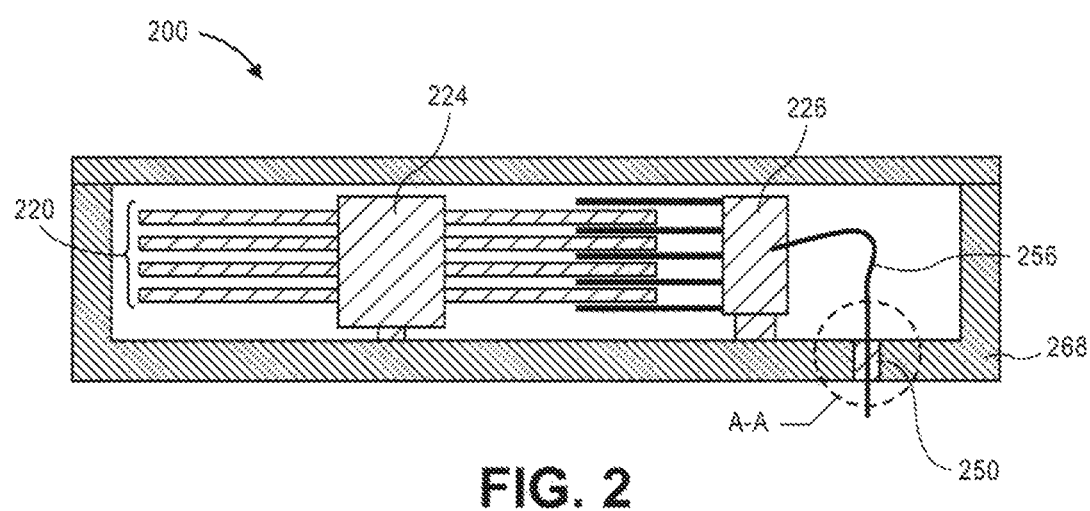
FIG. 2 is a cross-sectional side view illustrating a hard disk drive (HDD), according to an embodiment.

Recall that electronic systems that require hermetically sealed internal volume (e.g., a lighter-than-air gas filled, sealed HDD or system of HDDs) need a way of connecting electrical lines through the enclosure, with one approach utilizing a hermetic electrical connector or electrical "feedthrough" (generally, "sealed connector"). FIG. 2 is a cross-sectional side view illustrating a hard disk drive (HDD), according to an embodiment. For example, HDD 200 comprises at least one recording medium 220 (e.g., such as magnetic-recording medium 120 of FIG. 1) rotatably mounted on a spindle 224 (e.g., such as spindle 124 of FIG. 1) of a drive motor that drives the rotation of the recording medium 220, and a head stack assembly (HSA) 226 that carries and moves a head slider housing a read-write transducer to locations over the recording medium 220 for reading information from and writing information to the recording medium 220. HDD 200 further comprises a flexible cable assembly (FCA) 256 that electrically connects the HSA 226 to an electronic component external to the hermetically-sealed internal environment of HDD 200, such as to a printed circuit board (e.g., an "SOC", or system-on-a-chip) that may be coupled to the HDD 200. In so doing, the FCA 256 is routed through an interface 250 (e.g., mechanical and/or electrical), which includes a small opening, which is associated with an HDD enclosure base 268 (e.g., similar to a hermetically-sealed version of HDD housing 168 of FIG. 1). FIG. 2 further illustrates an area A-A near and including the interface 250, which may be referenced elsewhere herein.

The next generations of HDDs are being developed with larger and larger data capacities and, therefore, accelerated data transfer rates is a related developmental goal. Consequently, this could lead to the development of higher performance and multi-functional preamps and/or actuators. To achieve suitable electrical connectivity needed for these expected developments, while maintaining a low cost of a sealed connector, poses a challenge. Also, challenges will likely remain regarding the tradeoffs associated with a low leakage rate versus the cost of a suitable sealed connector.

For example, in order to meet the requirements of a sealed connector for next generation HDDs, it may be beneficial to increase the bonding force between the HDD enclosure base and the sealed connector and to improve the sealing performance. For another example, in order to continue improving the electrical transmission performance, impedance matching may be employed to reduce the capacitance component induced by metal layers associated with certain types of sealed connectors. That is, the space between overlapping metal layers within a sealed connector may be characterized as a "capacitance area" because the two conductive layers act as a capacitor, with the corresponding capacitance being proportional to the surface area of the conductive "plates" and inversely proportional to their distance apart. It is known that parasitic capacitance (e.g., an unavoidable and usually undesirable capacitance between parts of a circuit) can have a significantly deleterious and therefore unwanted effect on high frequency circuits and the high frequency signals transmitting therethrough. Generally, a high-frequency signal in the context of embodiments described herein is a signal having a frequency greater than several hundreds of megahertz, in order to achieve the data rate(s) specified in relevant interface protocols (e.g., SAS, SATA) for example. Further, a high-frequency signal transmission line is in contrast with, for example, power lines, ground lines, control lines, and the like. For another example, due to the aforementioned high performance and multi-functionalization of the preamp and/or actuator, increasing the number of sealed connector pins may be necessary, which could result in a larger sealed connector which would need more mounting space within the enclosure base.

Furthermore, increasing hard disk drive (HDD) capacity is an ever-present design goal. Increasing capacity with the same performance (as may be characterized by TOPS (I/O per second)) is one of the important design requirements. One solution to improve IOPS is to use multiple actuators, such as in a dual-actuator HDD. The dual-actuator HDD has two actuators so the number of signals needed may essentially double. In the context of a sealed HDD, a sealed feed-through connector is needed to support those signals. Glass feed-through and the printed circuit board assembly (PCBA) type sealed connectors would need to have an increased number of electrical contacts to adapt to an HDD with multiple actuators. Thus, a larger connector area is required, which may cause a higher helium leak rate than is desirable. Use of a flexible type electrical feed-through connector ("flex connector"), such as described elsewhere herein, can improve this issue due to a smaller size Board-to-Board (BTB) connector. However, the flex connector would need to use a united flex cable from the actuators, and a united flex cable has less flexibility of routing traces on the flex connector, and a detrimental impact on the manufacturability of an HDD.

Still further, BTB connectors are not tolerant of structural misalignment between connectors (plug and receptacle) where, in the context of an HDD, one side of the connector is on the PCBA and the other side of the connector is attached to the base by way of a feed-through connector. Thus, higher mounting accuracy and higher machining accuracy may be needed for mating connectors. One approach to handling misalignment may be to use a compression type connector (P2 connector), which does not require high accuracy, instead of a BTB connector. However, the compression type connector needs a larger space due to larger pad size. Because the larger pad for the compression type connector is detrimental to the signal quality, it may be preferable to use a BTB connector while absorbing any misalignment associated therewith.

Flexible Type Electrical Feed-Through

Figure 3A:
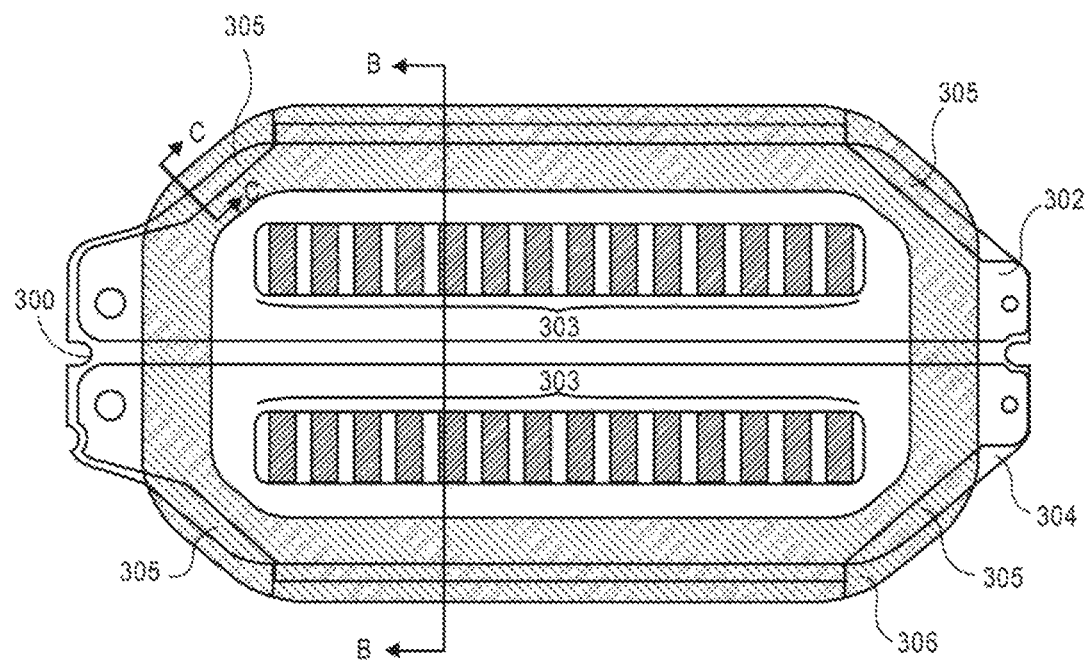
FIG. 3A is a plan view illustrating a flexible type electrical feed-through assembly, according to an embodiment.

FIG. 3A is a plan view illustrating a flexible type electrical feed-through assembly, according to an embodiment. Flexible type (or "flex-type") electrical feed-through assembly ("feed-through") 300 may be utilized as a sealed electrical connector (also referred to simply as a "flex connector"), such as for providing electrical transmission through an interface of a sealed internal environment (such as within a hermetically-sealed electronic component, for a non-limiting example, a sealed hard disk drive data storage device) and an external (e.g., ambient) environment.

Feed-through 300 comprises a flexible circuit assembly (FCA) 302 (or "a flexible printed circuit (FPC) part") and a metal part 304 (e.g., a metal plate) enveloped at least partially by, and coupled with (such as generally adhered to, thermally press-bonded to, and the like), the FCA 302, thereby forming a connector assembly comprising first pads 303 on one side of the connector assembly electrically connected to second pads (not visible) on the opposing side of the connector assembly. The metal part 304 provides structural strength and rigidity to the feed-through 300, since the FCA 302 is flexible and relatively not rigid.

Figure 3B:
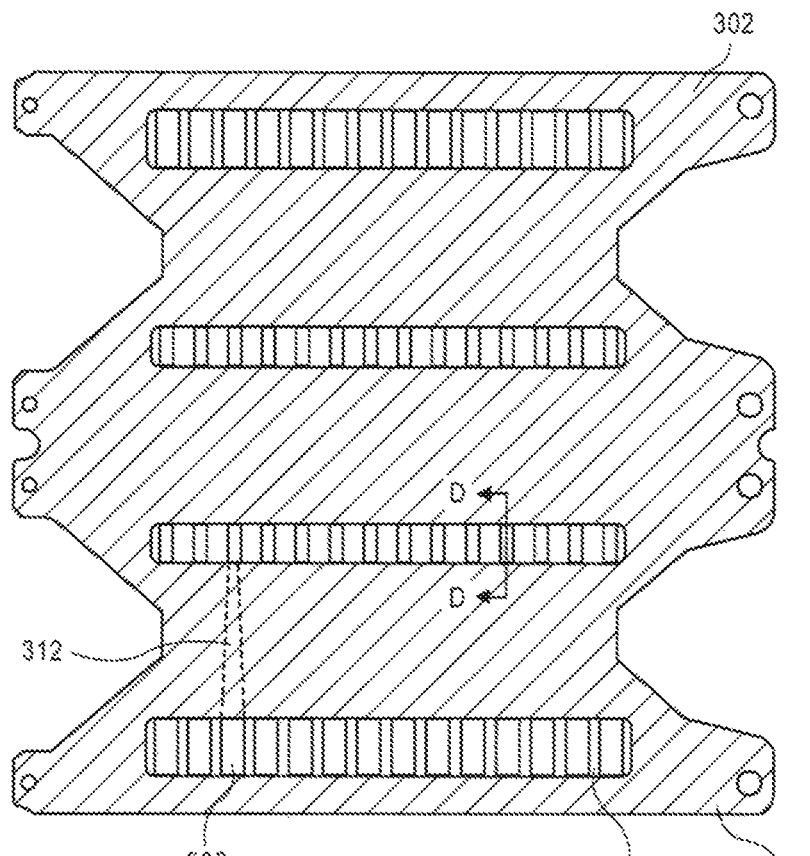
FIG. 3B is a plan view illustrating a flexible cable pattern for a flexible type electrical feed-through, according to an embodiment.
Figure 3C:
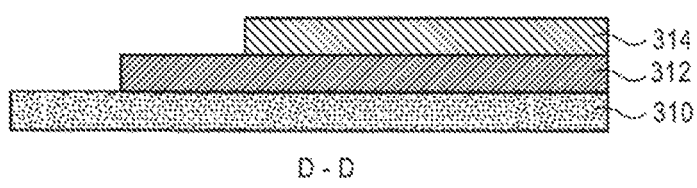
FIG. 3C is a cross-sectional side view illustrating a portion of the flexible cable pattern of FIG. 3B, according to an embodiment.

FIG. 3B is a plan view illustrating a flexible cable pattern for a flexible type electrical feed-through, and FIG. 3C is a cross-sectional side view (see cut A-A of FIG. 3B) illustrating a portion of the flexible cable pattern of FIG. 3B, according to an embodiment. The FCA 302 comprises a laminate structure (see FIG. 3C) comprising a base insulating layer 310 (for a non-limiting example, a polyimide material), a conductor layer 312 over the insulating layer 310, and a cover insulating layer 314 over the conductor layer 312, where the conductor layer 312 includes a plurality of electrical connection pads 303 and electrical conductors (such as copper electrical traces constituent to the conductor layer 312) connecting pairs of the pads, whereby the pads 303 of the conductor layer 312 are exposed by an opening(s) in the cover insulating layer 314. According to an embodiment, the base insulating layer 310 and/or the cover insulating layer 314 are constructed of a low permeability (e.g., to helium or other lighter-than-air gas) material, such as a polyimide material.

While terminology such as "top", "bottom", "over", "upper", "lower", and the like may be used herein to describe the feed-through 300 (and feed-through 700 of FIG. 7A), note that an electrical feed-through such as feed-through 300 (and feed-through 700) may not have a true top and a true bottom so terms such as those are used herein for purposes of reference and relative positioning rather than for a characterization of how feed-through 300 (and feed-through 700) may be manufactured or assembled or installed as a sub-component of a larger, higher-level component.

According to an embodiment, the FCA 302 is patterned or shaped (see FIG. 3B for an example) such that, when enveloping the metal part 304, one or more portions 305 (FIG. 3A; 4 areas depicted) of the metal part 304 are not covered by the FCA 302 and are thereby exposed. With reference to FIG. 3A, an adhesive 306 (for a non-limiting example, a pre-formed applicable epoxy) may be utilized to install the feed-through 300 to a metal portion of an enclosure base (e.g., of a sealed hard disk drive), where the adhesive 306 overlaps with portions of the FCA 302 and, notably, the one or more portions 305 of the metal part 304. Hence, the exposed one or more portions 305 of the metal part 304 of the feed-through 300 can directly interface with or mate with the metal portion of the base (e.g., an aluminum alloy), with the adhesive 306 interposed therebetween, thereby forming a hermetic seal between the feed-through 300 and the enclosure base, as described in more detail elsewhere herein. According to an embodiment, with the adhesive 306 overlapping with portions of the FCA 302, the adhesive 306 further bonds the portion of the FCA 320 to the metal base. According to an embodiment, a low permeability epoxy adhesive such as an alumina-filled epoxy is considered suitable for achieving a low leak rate through the adhesive 306.

Figure 4A:
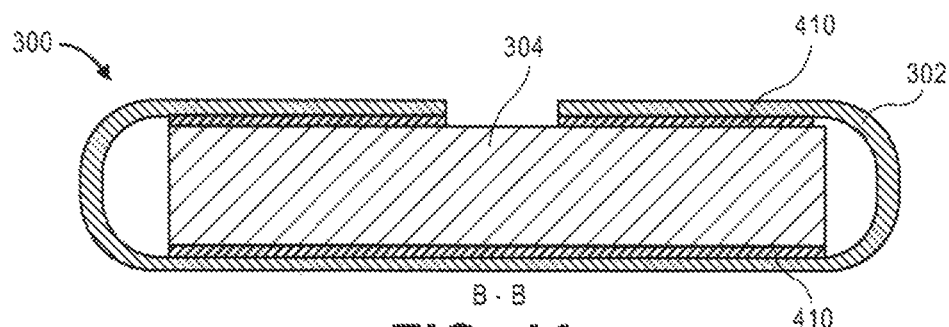
FIG. 4A is a cross-sectional side view illustrating the flexible type electrical feed-through of FIG. 3A, according to an embodiment.
Figure 4B:
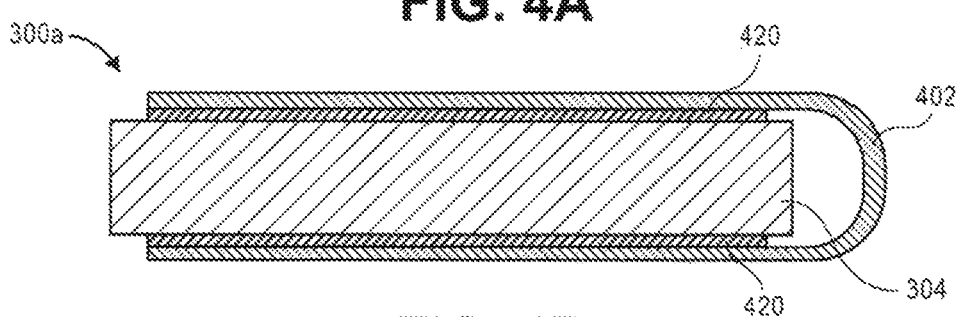
FIG. 4B is a cross-sectional side view illustrating a flexible type electrical feed-through, according to another embodiment.

FIG. 4A is a cross-sectional side view (see cut B-B of FIG. 3A) illustrating the flexible type electrical feed-through assembly of FIG. 3A, according to an embodiment. FIG. 4A illustrates and reiterates that the feed-through 300 comprises the FCA 302 (with the layers 310-314 of FIG. 3C not demarcated here) wrapped around the metal part 304, with the two parts coupled together with an adhesive 410 such as an adhesive film. FIG. 4B is a cross-sectional side view illustrating a flexible type electrical feed-through, according to an alternative embodiment. FIG. 4B illustrates that with an alternative embodiment a feed-through 300a may comprise an FCA 402, constructed similarly as FCA 302 (with the layers 310-314 of FIG. 3C) alternatively wrapped around the metal part 304, with the two parts coupled together with an adhesive 420 such as an adhesive film. According to an embodiment, a low permeability epoxy adhesive such as an alumina-filled epoxy is considered suitable for achieving a low leak rate through the adhesives 410, 420.

Flexible Type Electrical Feed-Through Installation Arrangement

Figure 5:
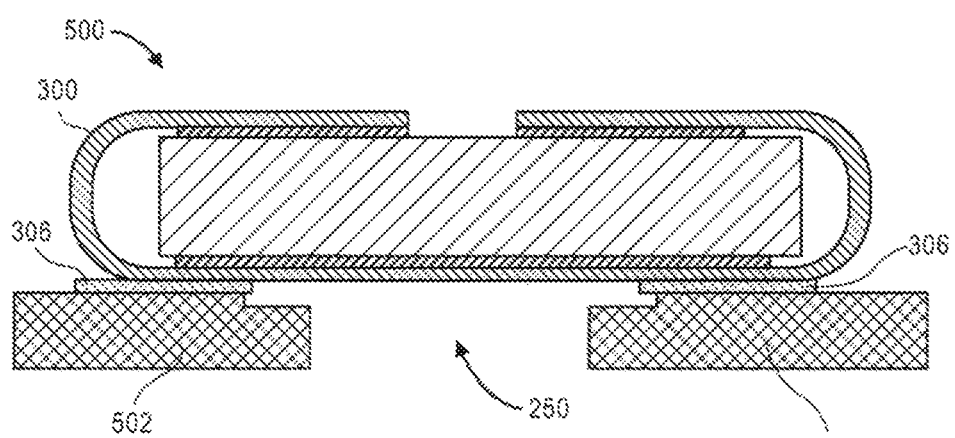
FIG. 5 is a cross-sectional side view illustrating a flexible type electrical feed-through of FIG. 3A installation arrangement, according to an embodiment.

FIG. 5 is a cross-sectional side view illustrating a flexible type electrical feed-through of FIG. 3A installation arrangement, according to an embodiment. Installation 500 comprises the feed-through 300 adhered to, bonded to, sealed with, at an interface 250 with an enclosure base 502 by adhesive 306.

Figure 6A:
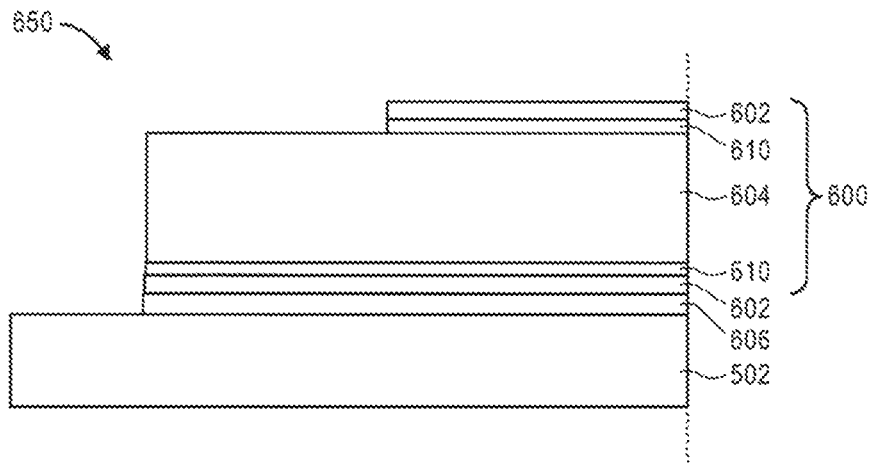
FIG. 6A is a cross-sectional side view illustrating a flexible type electrical feed-through installation arrangement, according to an embodiment.

FIG. 6A is a cross-sectional side view illustrating a flexible type electrical feed-through installation arrangement, according to an embodiment. Installation 650 comprises a feed-through 600 that differs from feed-through 300 (FIG. 3A) in that a metal part 604 is not exposed directly to the enclosure base 502 and an interposed adhesive 606, like the one or more portions 305 of the metal part 304 of feed-through 300 are exposed to adhesive 306 due to the shape of the FCA 302 (FIG. 3B). Thus, the adhesive 606 adheres a flexible circuit assembly 602 to the base 502 rather than directly adhering the metal part 604 to the base 502.

Figure 6B:
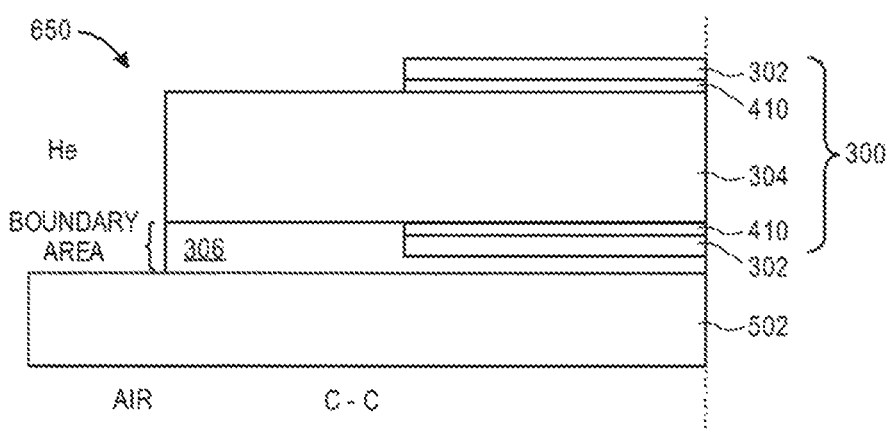
FIG. 6B is a cross-sectional side view illustrating a flexible type electrical feed-through installation arrangement, according to an embodiment.

FIG. 6B is a cross-sectional side view illustrating a flexible type electrical feed-through installation arrangement, according to an embodiment. Installation 660 comprises feed-through 300 comprising the metal part 304 exposed to the metal base 502 with the interposed adhesive 306, by way of the one or more portions 305 of the metal part 304, due to the shape of the FCA 302 (FIG. 3B). Therefore, the bonding force between the feed-through 300 and the metal base 502 is improved over the bonding force between the feed-through 600 and the metal base 502, by partially exposing the portions 305 of the metal part 304 inside the adhesive area (a lighter-than-air gas and adhesive "boundary area") to the metal base 502, thereby providing a metal-to-metal bond. Advantageously, a stronger seal at the boundary area may be expected using a high adhesive strength metal-to-metal bond.

Furthermore, greater sealing performance (e.g., hermetically sealing the internal lighter-than-air gas environment, such as within a helium-filled sealed HDD, from the external environment) may advantageously be provided. This is at least in part because an adhesive film such as adhesive 610 (FIG. 6A) (and adhesive 410 (FIG. 6B)), between the flexible circuit assembly 602 and the metal part 604, is conventionally a relatively more permeable material than polyimide and the adhesive 306 used in the boundary area to bond the feed-through 300 to the metal base 502 and, by implementation of the described "exposed metal" embodiments, the contact area of adhesive 410 is reduced (e.g., compare the relative length of adhesive 610 in FIG. 6A with the length of adhesive 410 in FIG. 6B). Experimentation has indicated the potential for a 7% reduction in the helium leakage rate between a feed-through installation such as installation 650 of FIG. 6A and a feed-through installation such as installation 660 of FIG. 6B, in which a feed-through such as feed-through 300 is implemented at the interface 250 (FIGS. 2, 5) of a hermetically-sealed internal environment and an external environment.

Flexible Type Electrical Feed-Through with Board-to-Board Connector

Figure 7A:
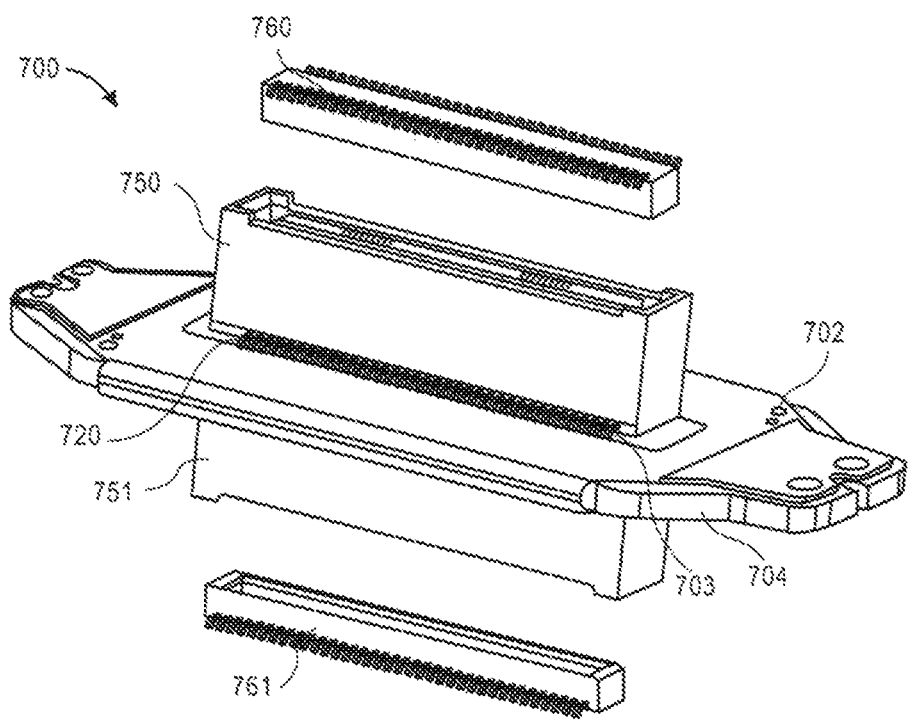
FIG. 7A is an exploded perspective view illustrating a board-to-board flexible type electrical feed-through/connector assembly, according to an embodiment.
Figure 7B:
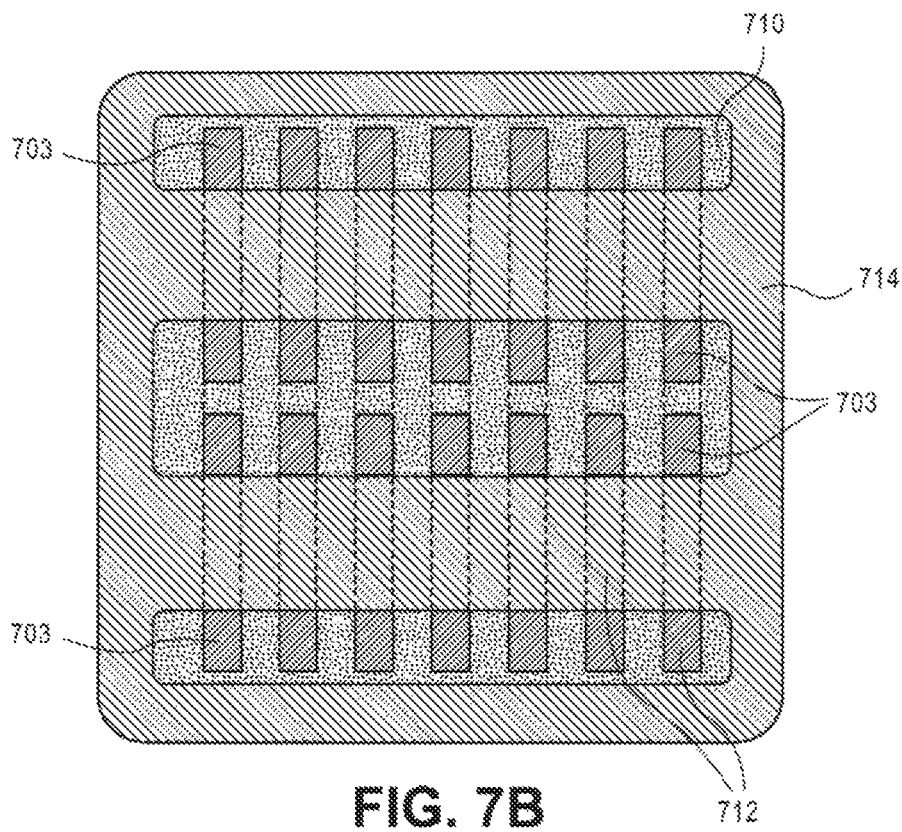
FIG. 7B is a top view illustrating a flexible cable pattern for the board-to-board flexible type electrical feed-through of FIG. 7A, according to an embodiment.

FIG. 7A is an exploded perspective view illustrating a board-to-board flexible type electrical feed-through/connector assembly, and FIG. 7B is a top view illustrating a flexible cable pattern for the board-to-board flexible type electrical feed-through of FIG. 7A, each according to an embodiment. Flexible type (or "flex-type") board-to-board (BTB) electrical feed-through assembly ("BTB feed-through assembly") 700 may be utilized as a sealed electrical connector, such as for providing electrical transmission through an interface of a sealed internal environment (such as within a hermetically-sealed electronic component, for a non-limiting example, a sealed hard disk drive data storage device) and an external (e.g., ambient) environment.

BTB feed-through assembly 700 comprises a flexible circuit assembly (FCA) 702 (or "a flexible printed circuit (FPC) part") and a metal part 704 (e.g., a metal plate) enveloped at least partially by, and coupled with (such as generally adhered to, thermally press-bonded to, and the like), the FCA 702, thereby forming a connector assembly comprising first pads 703 on one side of the connector assembly electrically connected to second pads (not visible) on the opposing side of the connector assembly. The FCA 702 comprises a similar cross-sectional construction as the FCA 302 (see, e.g., FIG. 3C), having a laminate structure comprising a base insulating layer 710 (for a non-limiting example, a polyimide material), a conductor layer 712 over the insulating layer 710, and a cover insulating layer 714 over the conductor layer 712, where the conductor layer 712 includes a plurality of electrical connection pads 703 and electrical conductors (such as copper electrical traces constituent to the conductor layer 712) connecting pairs of the pads, whereby the pads 703 of the conductor layer 712 are exposed by an opening(s) in the cover insulating layer 714, as depicted in FIG. 7B. According to an embodiment, the base insulating layer 710 and/or the cover insulating layer 714 are constructed of a low permeability (e.g., to helium or other lighter-than-air gas) material, such as a polyimide material.

BTB feed-through assembly 700 further comprises one or more board-to-board (BTB) connector receptacles electrically connected to the FCA 702. For example, BTB feed-through assembly 700 is depicted as comprising a first BTB connector receptacle 750 electrically connected to the FCA 702 on one side and a second BTB connector receptacle 751 electrically connected to the FCA 702 on the other opposing side. A board-to-board connector is typically used to connect printed circuit boards (PCBs) via a series of terminals or leads or pins, generally, "terminals 720". Here, such terminals 720 of each BTB connector receptacles, such as BTB connector receptacles 750 and 751, are electrically connected to corresponding pads 703 of the FCA 702 of feed-through assembly 700. Preferably, a narrow pin pitch BTB connector is used, which enables a smaller pad area for the pads 703 of the BTB feed-through assembly 700, for example in comparison with a pad area needed for a compression-type connector. Therefore, with smaller pads, electrical transmission performance can be improved by reducing the capacitance component of the BTB feed-through assembly 700. Furthermore, with a narrow pin pitch it is possible to increase the number of terminals without a larger outline size of the BTB feed-through assembly 700.

FIG. 7A further depicts an exploded view of a first mating BTB plug 760, which would be electrically connected to a separate component (e.g., a flexible cable assembly internal to a sealed electronic component, such as FCA 256 of FIG. 2), and which is configured to mate with and electrically connect to the corresponding BTB receptacle 750. Likewise, FIG. 7A further depicts an exploded view of a second mating BTB plug 761 (or header), which would be electrically connected to a separate component (e.g., a printed circuit board assembly (PCBA) external to the sealed electronic component, such as PCBA 950 of FIG. 9), and which is configured to mate with and electrically connect with the corresponding BTB receptacle 751. If the BTB feed-through assembly 700 were installed with an electronic component in an opposite position, then BTB plug 760 may be electrically connected to a PCBA while BTB plug 761 would be electrically connected to an FCA 256. According to an embodiment, the arrangement is reversed, whereby BTB connector plugs may be coupled to the FCA 702, with BTB connector receptacles coupled to the other connected components (e.g., a FCA and/or a PCBA).

Figure 8A:
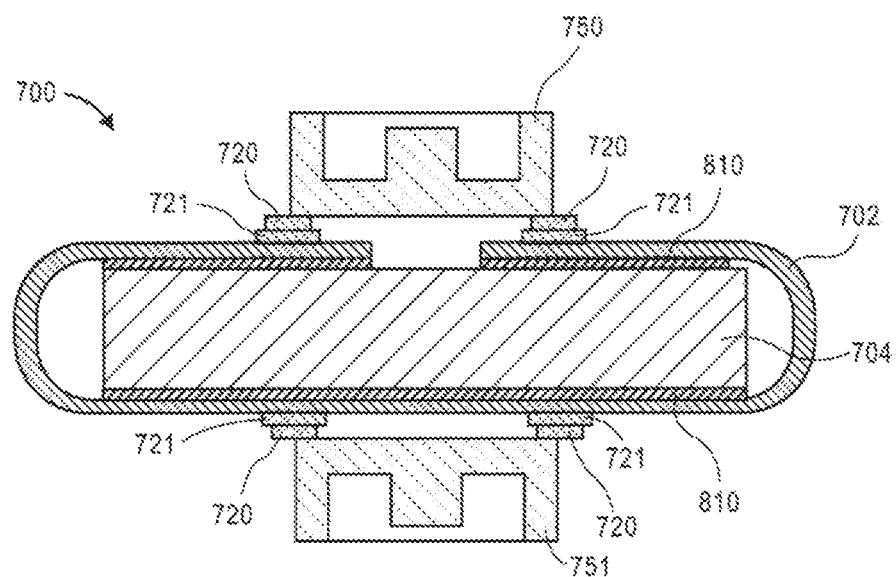
FIG. 8A is a cross-sectional side view illustrating the board-to-board flexible type electrical feed-through/connector assembly of FIG. 7A, according to an embodiment.
Figure 8B:
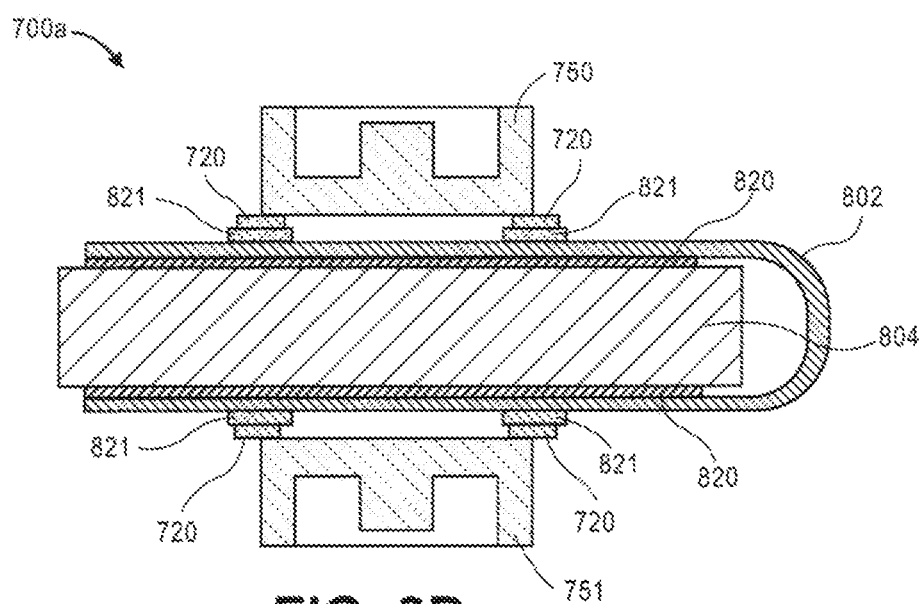
FIG. 8B is a cross-sectional side view illustrating a board-to-board flexible type electrical feed-through/connector assembly, according to another embodiment.

FIG. 8A is a cross-sectional side view illustrating the board-to-board flexible type electrical feed-through/connector assembly of FIG. 7A, according to an embodiment. FIG. 8A illustrates and reiterates that the BTB feed-through assembly 700 comprises the FCA 702 (with the layers 710-714 not demarcated here) wrapped around the metal part 704, with the two parts coupled together with an adhesive 810 such as an adhesive film. FIG. 8A further illustrates each BTB connector receptacle 750, 751 electrically connected to the FCA 702 by way of the terminals 720 or leads of the BTB connector receptacle 750, 751 and the pads 703 (FIG. 7A) of the FCA 702, such as with solder 721, for a non-limiting example. FIG. 8B is a cross-sectional side view illustrating a board-to-board flexible type electrical feed-through/connector assembly, according to another embodiment. FIG. 8B illustrates that with an alternative embodiment a BTB feed-through assembly 700a comprises an FCA 802 (with similar layers 710-714, not shown here) wrapped around the metal part 804, with the two parts coupled together with an adhesive 820 such as an adhesive film. FIG. 8B further illustrates each BTB connector receptacle 750, 751 electrically connected to the FCA 802 by way of the terminals 720 or leads of the BTB connector receptacle 750, 751 and the pads similar to pads 703 (FIG. 7A) of the FCA 802, such as with solder 821, for a non-limiting example.

Figure 9:
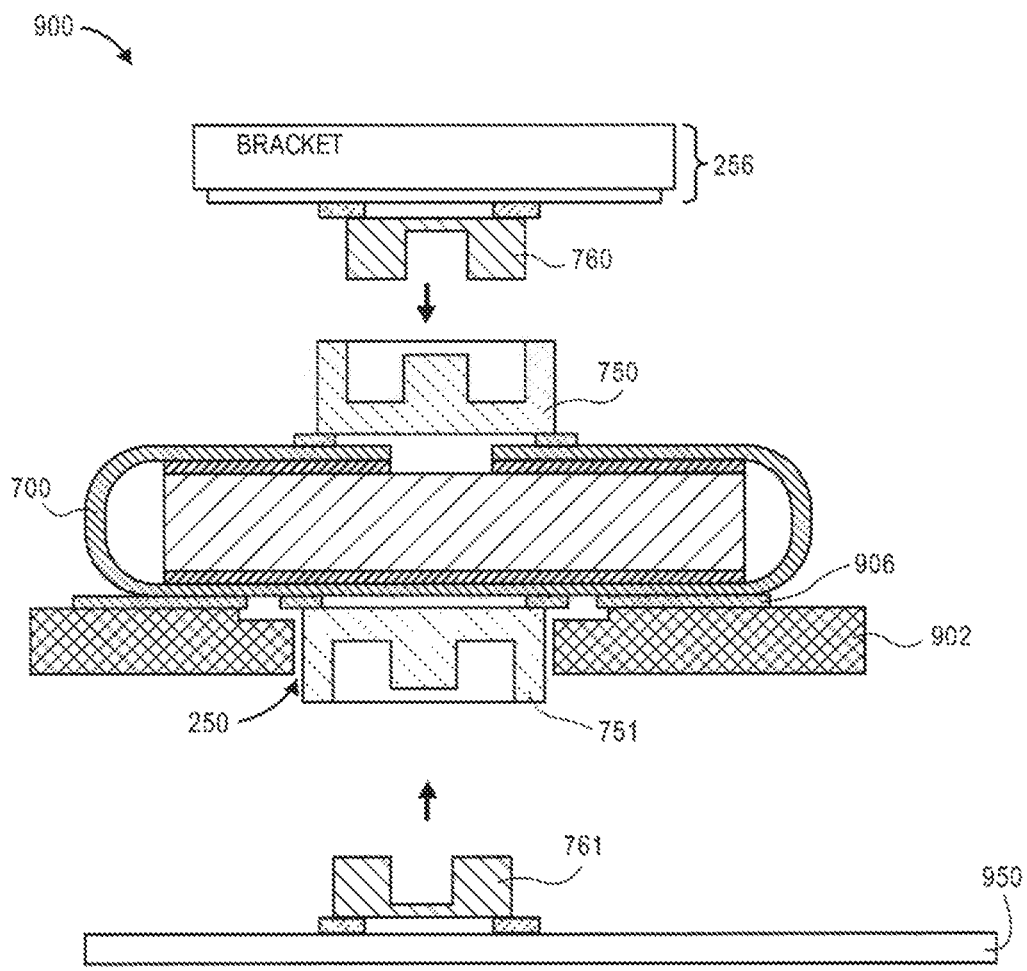
FIG. 9 is a cross-sectional side view illustrating the board-to-board flexible type electrical feed-through of FIG. 7A installation arrangement, according to an embodiment.

Flexible Type Electrical Feed-Through with Board-to-Board Connector Installation Arrangement FIG. 9 is a cross-sectional side view illustrating the board-to-board flexible type electrical feed-through of FIG. 7A installation arrangement, according to an embodiment. Installation 900 comprises the BTB feed-through assembly 700 adhered to, bonded to, sealed with, at an interface 250 with an enclosure base 902 by adhesive 906. FIG. 9 further illustrates a BTB connector plug 760 coupled to an FCA such as FCA 256 to form a higher-level component, intended for mechanically mating with and electrically connecting to the BTB connector receptacle 750 of BTB feed-through assembly 700 and, similarly, a BTB connector plug 761 coupled to a PCB 950 to form a higher-level PCBA component, intended for mechanically mating with and electrically connecting to the BTB connector receptacle 751 of BTB feed-through assembly 700. According to an embodiment, a low permeability epoxy adhesive such as an alumina-filled epoxy is considered suitable for achieving a low leak rate through the adhesive 906. Note that the base 902 window through which the BTB receptacle 751 extends at interface 250 can serve as a guide hole to align the BTB feed-through assembly 700. Furthermore, the stepped structural configuration of the base 902 around the window through which the BTB receptacle 751 extends at interface 250 functions to inhibit or prevent an electrical short among the BTB connector receptacle 751 and the adhesive 906, in the scenario in which an electrically conductive adhesive is used. Also notable is that the BTB connector receptacle housing may be fabricated with a low permeability (e.g., to He or other lighter-than-air gas) material.

Figure 10:
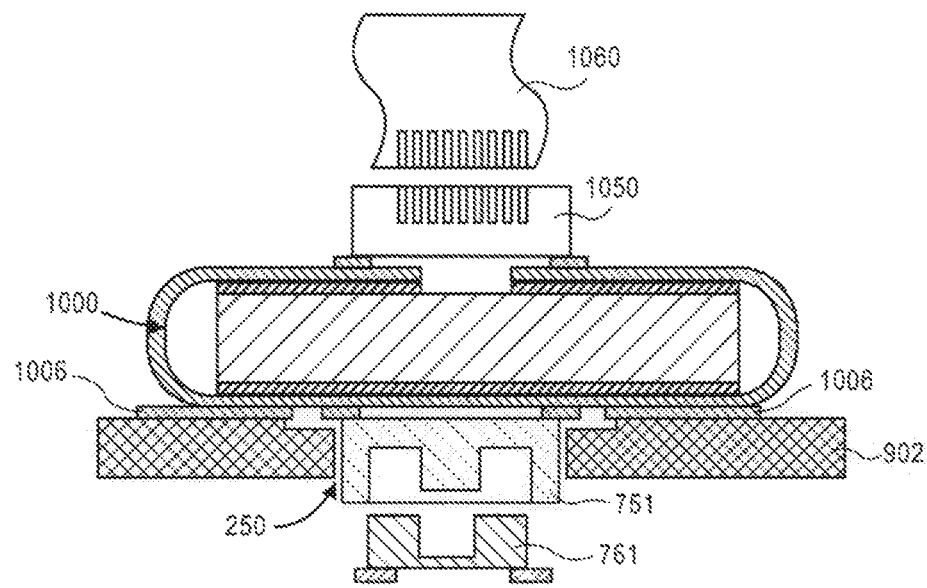
FIG. 10 is a cross-sectional side view illustrating a board-to-board flexible type electrical feed-through installation arrangement, according to an embodiment.

FIG. 10 is a cross-sectional side view illustrating a board-to-board flexible type electrical feed-through installation arrangement, according to an embodiment. The alternative installation of FIG. 10 comprises a BTB feed-through assembly 1000 adhered to, bonded to, sealed with, at an interface 250 with an enclosure base 902 by adhesive 1006, where BTB feed-through assembly 1000 is constructed and configured similarly to BTB feed-through assembly 700 (FIGS. 7A, 8A) except for the differences described immediately hereafter. FIG. 10 further illustrates a BTB connector plug 761 for coupling to a PCB such as PCB 950 (FIG. 9) to form a higher-level PCBA component (as previously described), intended for mechanically mating with and electrically connecting to the BTB connector receptacle 751 of BTB feed-through assembly 1000. Instead of utilizing a plug such as a BTB connector plug 760 for coupling to an FCA such as FCA 256 (FIG. 2) to form a higher-level component, this installation utilizes a board-to-flex (BTF) connector (otherwise referred to as a "ribbon cable connector") for electrically connecting a BTF connector receptacle 1050 of BTB feed-through assembly 1000 with a BTF connecter flex 1051, such as at a terminal end of an FCA 1060. Both board-to-board connectors and board-to-flex connectors may be referred to generally herein as board-to-component connectors.

Figure 11:
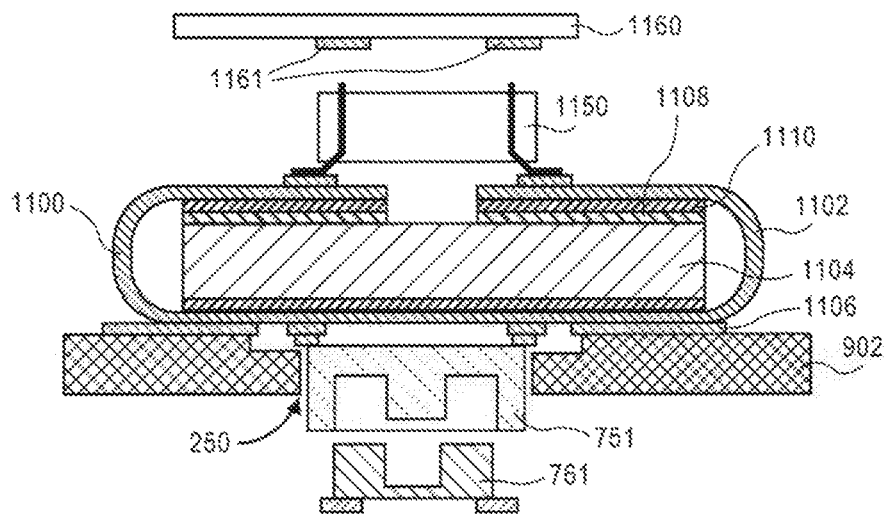
FIG. 11 is a cross-sectional side view illustrating a board-to-board flexible type electrical feed-through installation arrangement, according to another embodiment.

FIG. 11 is a cross-sectional side view illustrating a board-to-board flexible type electrical feed-through installation arrangement, according to another embodiment. The alternative installation of FIG. 11 comprises a BTB feed-through assembly 1100 adhered to, bonded to, sealed with, at an interface 250 with an enclosure base 902 by adhesive 1106. FIG. 11 further illustrates a BTB connector plug 761 for coupling to a PCB such as PCB 950 (FIG. 9) to form a higher-level PCBA component (as previously described), intended for mechanically mating with and electrically connecting to the BTB connector receptacle 751 of BTB feed-through assembly 1100. Instead of utilizing a plug such as a BTB connector plug 760 for coupling to an FCA such as FCA 256 (FIG. 2) to form a higher-level component, this installation utilizes a compression-type connector 1150 for electrically connecting BTB feed-through assembly 1100 with electrical connection pads 1161 at the terminal end of an FCA 1160. A compression-type connector has spring terminals (also referred to as "compression-type terminals" or "compression-type pins", or at times referred to in the art as a "P2 connector"), which is a style of connector that can be used to electrically connect to and communicate with a PCB, for example.

As previously mentioned, using a compression-type connector may have a detrimental effect on electrical transmission performance because of the larger electrical connection pads needed. Thus, the installation of FIG. 11 includes a polyimide stiffener or resin bracket, generally, insulator 1108, between the FCA 1102 and the metal part 1104 of BTB feed-through assembly 1100, to increase the insulating distance from the conductors layer within the FCA 1102 to the metal part 1104 and, consequently, to improve electrical transmission performance characteristics. However, a compression-type connector is not ideal for use on the interface 250 side of the BTB feed-through assembly 1100, as the insulator 1108 may increase the leak rate through the installation.

Reiterating, one possible implementation of a low permeability electrical feed-through such as the various feed-through connectors described herein (e.g., feed-through 300, 300a; BTB feed-through assembly 700, 700a, 1000, 1000) may be for use with a sealed hard disk drive that includes a hermetically sealed gas-filled (e.g., a lighter-than-air type gas, such as helium, nitrogen, etc., for non-limiting examples) enclosure that has an opening extending through an HDD base (e.g., similar to a hermetically-sealed version of housing 168 of FIG. 1). In such an implementation, an electrical connector may be disposed inside the enclosure and adjacent to the opening, and which can be electrically connected to a low permeability electrical feed-through which spans the opening. For example, an electrical connector may be electrically connected with an internal HDD flexible interconnect cable (e.g., flex cable 156 of FIG. 1), and with the feed-through by way of electrical connection pads. Similarly, an electrical connector may be electrically connected to an external HDD PCB (i.e., attached to the HDD) and with the feed-through by way of electrical connection pads. Broadly, the described feed-through connectors may serve the purpose of facilitating electrical contact and connection between the outside and the inside of the hermetically sealed cavity/enclosure.

Method of Manufacturing an Electrical Feed-Through

FIG. 12 is a flow diagram illustrating a method of manufacturing an electrical feed-through component, according to an embodiment.

At block 1202, a laminate flexible cable assembly (FCA) is formed, comprising a base insulating layer, a conductor layer over the insulating layer, and a cover insulating layer over the conductor layer, wherein the conductor layer comprises a plurality of electrical connection pads and electrical conductors connecting pairs of the pads. For example, form an FCA such as FCA 302 (FIGS. 3B, 3C), 402 (FIG. 4B), 702 (FIG. 7B), 802 (FIG. 8B), 1102 (FIG. 11).

At block 1204, the FCA is folded at least in part around a metal plate. For example, fold FCA 302 around metal part 304 (FIGS. 3A, 4A, 4B), or fold FCA 702 around metal part 704 (FIGS. 7A, 8A), or fold FCA 802 around metal part 804 (FIG. 8B), or fold FCA 1102 around metal part 1104 (FIG. 11).

At block 1206, the FCA is adhered to the metal plate, forming a connector assembly comprising first pads of the pairs on an upper side of the connector assembly electrically connected via the conductors to second pads of the pairs on the lower side of the connector assembly. For example, FCA 302 is adhered to metal part 304 with adhesive 410 (FIG. 4A), or FCA 402 is adhered to metal part 404 with adhesive 420 (FIG. 4B), or FCA 702 is adhered to metal part 704 with adhesive 810 (FIG. 8A), or FCA 802 is adhered to metal part 804 with adhesive 820 (FIG. 8B), or FCA 1102 is adhered to metal part 1104 with adhesive 1110 (FIG. 4A).

Method of Sealing a Hermetic Interface

FIG. 13 is a flow diagram illustrating a method of sealing an interface between a hermetically-sealed internal environment and an external environment, according to an embodiment. At block 1302, provide electrical transmission means for transmitting electrical signals through the interface. At block 1304, provide means for mating a metal portion of the electrical transmission means with a metal portion of a base of the electronic component. At block 1306, provide hermetically-sealing means for bonding the metal portion of the electrical transmission means with the metal portion of the base.

Sealed Electrical Feed-Through Connector for Multi-Actuator HDD

Figure 14:
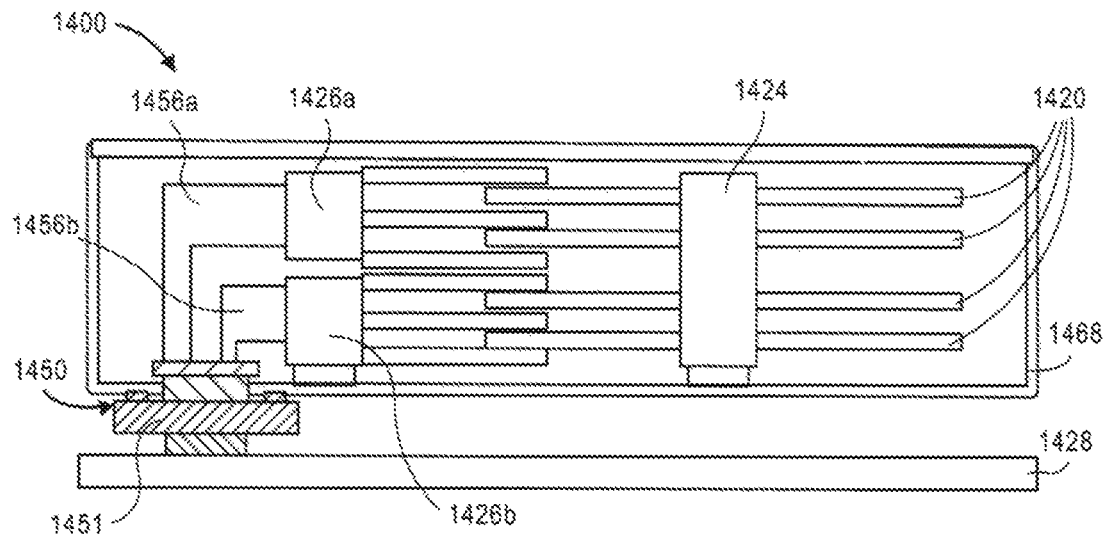
FIG. 14 is a cross-sectional side view illustrating a multi-actuator hard disk drive (HDD), according to an embodiment.

FIG. 14 is a cross-sectional side view illustrating a multi-actuator hard disk drive (HDD), according to an embodiment. For example, multi-actuator HDD 1400 comprises a plurality of recording media 1420 (e.g., such as magnetic-recording medium 120 of FIG. 1) rotatably mounted on a spindle 1424 (e.g., such as spindle 124 of FIG. 1) of a drive motor that drives the rotation of the recording media 1420, and a first head stack assembly (HSA) 1426a and a second HSA 1426b that each carries and moves head sliders housing a read-write transducer to locations over one or more of the recording media 1420 for reading information from and writing information to the recording media 1420. Multi-actuator HDD 1400 further comprises a first flexible cable assembly (FCA) 1456a and a second FCA 1456b that electrically connect the respective HSA 1426a, 1426b to an electronic component external to the hermetically-sealed internal environment of multi-actuator HDD 1400, such as to a printed circuit board assembly (PCBA) 1428 (e.g., to an "SOC", or system-on-a-chip) that may be coupled to an enclosure base 1468 (e.g., similar to a hermetically-sealed version of HDD housing 168 of FIG. 1) of the multi-actuator HDD 1400. In so doing, each FCA 1456a, 1456b is routed through an interface 1450 (e.g., mechanical and/or electrical), which includes a small opening in the HDD enclosure base 1468. According to an embodiment, a flexible-type sealed electrical feed-through connector assembly 1451, embodiments of which are described elsewhere herein (e.g., BTB flex feed-through connector 1500 of FIG. 15), is implemented at the interface 1450 to provide transmission of electrical signals through the interface 1450 of the hermetically sealed multi-actuator HDD 1400.

The number of actuators constituent to a multi-actuator HDD, or "multiple actuator HDD" (e.g., split actuator, dual actuator, triple actuator, etc.) may vary from implementation to implementation, and a multi-actuator HDD having two actuators is referenced and described herein for purposes of example. In the context of a sealed multi-actuator HDD, approaches to a smaller sized sealed connector using a flex feed-through connector that can reduce connector size includes multiple (e.g., two) connectors on one side to connect to the multiple (e.g., two) actuators, and the traces of the two internal connectors combine to one larger connector for the external PCBA, according to an embodiment.

The separate connectors can provide for better manufacturability of multi-actuator HDDs, for example, because the two actuators can therefore be assembled separately.

Figure 15:
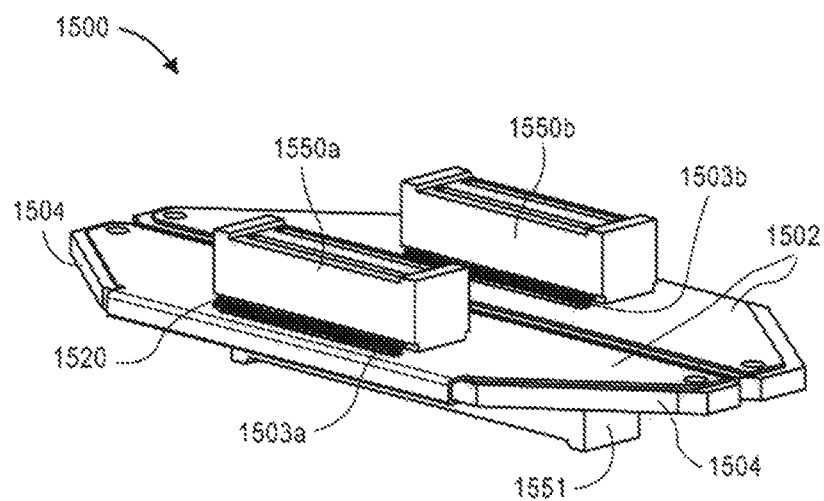
FIG. 15 is a perspective view illustrating a board-to-board flexible type electrical feed-through/connector assembly, according to an embodiment.

FIG. 15 is a perspective view illustrating a board-to-board flexible type electrical feed-through connector assembly, according to an embodiment. Board-to-board (BTB) flexible type (or "flex-type") electrical feed-through connector assembly 1500 ("BTB flex feed-through connector 1500") may be utilized as a sealed electrical connector, such as for providing electrical transmission through an interface of a sealed internal environment (such as within a hermetically-sealed electronic component, for a non-limiting example, a sealed hard disk drive data storage device) and an external (e.g., ambient) environment. Similarly to BTB feed-through assembly 700 of FIG. 7A, BTB flex feed-through connector 1500 comprises a flexible circuit assembly (FCA) 1502 (or "a flexible printed circuit (FPC) part") and a metal part 1504 (e.g., a metal plate) enveloped at least partially by, and coupled with (for non-limiting examples, adhered to, thermally press-bonded to, and the like) the FCA 1502, thereby forming a connector assembly comprising a first set of first pads 1503a and a second set of first pads 1503b on one side of the connector assembly electrically connected to second pads (not visible) on the opposing side of the connector assembly. According to an embodiment, the FCA 1502 is wrapped around the metal part 1504 such that the two ends of the FCA 1502 meet or nearly meet at the top surface of the BTB flex feed-through connector 1500 and, therefore each of the first set and second set of first pads are positioned near a respective end of the FCA 1502.

According to an embodiment, the FCA 1502 comprises a similar cross-sectional construction as the FCA 302 (see, e.g., FIG. 3C), having a laminate structure comprising a base insulating layer such as base insulating layer 710 of FIG. 7B (for a non-limiting example, a polyimide material), a conductor layer such as conductor layer 712 of FIG. 7B over the insulating layer, and a cover insulating layer such as cover insulating layer 714 of FIG. 7B over the conductor layer, where the conductor layer includes a plurality of electrical connection first pads 1503a, 1503b and electrical conductors (such as copper electrical traces constituent to the conductor layer) connecting pairs of the pads, whereby the first pads 1503a, 1503b of the conductor layer are exposed by an opening(s) in the cover insulating layer, similarly to as depicted in FIG. 7B. According to an embodiment, the base insulating layer and/or the cover insulating layer are constructed of a low permeability (e.g., to helium or other lighter-than-air gas) material, such as a polyimide material.

According to an embodiment, BTB flex feed-through connector 1500 further comprises one or more board-to-board (BTB) connector parts (e.g., a connector receptacle or plug) electrically connected to the FCA 1502. For example, BTB flex feed-through connector 1500 is depicted as comprising (a) a first BTB connector part 1550a electrically connected to the first set of first pads 1503a of FCA 1502 on one side, (b) a second BTB connector part 1550b electrically connected to the second set of first pads 1503b of FCA 1502 on the same side, and (c) a third BTB connector part 1551 electrically connected to the FCA 1502 on the other opposing side. A board-to-board connector is typically used to connect printed circuit boards (PCBs) via a series of terminals or leads or pins, generally, "terminals 1520". Here, such terminals 1520 of each BTB connector part, such as BTB connector parts 1550a, 1550b, (and 1551) are electrically connected to corresponding pads 1503a, 1503b of the FCA 1502 of BTB flex feed-through connector 1500. According to an embodiment, board-to-flex (BTF) connectors may be implemented in place of BTB connectors 1550a, 1550b for electrically connecting a BTF connector receptacle with a BTF connecter flex, such as at a terminal end of an FCA 1456a, 1456b (see, e.g., FIG. 10).

In the case of BTB connectors, preferably, a narrow pin pitch BTB connector is used, which enables a smaller pad area for the pads 1503a, 1503b of the BTB flex feed-through connector 1500, for example in comparison with a pad area needed for a compression-type (e.g., P2) connector. Therefore, with smaller pads, electrical transmission performance can be improved by reducing the capacitance component of the BTB flex feed-through connector 1500. Furthermore, with a narrow pin pitch it is possible to increase the number of terminals without a larger outline size of the BTB flex feed-through connector 1500, thereby beneficially affecting any leak rate therethrough. Still further, by using separate connector parts 1550a, 1550b on the one side of the BTB flex feed-through connector 1500, rather than bridging the centerline gap with a single larger connector, the accuracy of aligning the end edges of the FCA 1502 is not as critical as it otherwise might be.

In the context of implementing the BTB flex feed-through connector 1500 with a multi-actuator HDD such as HDD 1400 (FIG. 14), the first BTB connector part 1550a would be used to electrically connect one FCA 1456a or 1456b through the interface 1450 to the PCBA 1428, while the second BTB connector part 1550b would be used to electrically connect the other FCA 1456a or 1456b through the interface 1450 to the PCBA 1428, both by way of the third BTB connector part 1551 which would be coupled with and electrically connected to the PCBA 1428. For example, the BTB flex feed-through connector 1500 may be implemented to serve the function of the flexible-type sealed electrical feed-through connector assembly 1451 of FIG. 14. Hence, a single separate BTB connector can be utilized for each respective FCA 1456a, 1456b, which enables more flexibility in routing of the conductor layer traces of the FCA 1502 due to the freedom of design with respect to the position and layout of the BTB connectors 1550a, 1550b onto the FCA 1502. For example, shorter traces may be implemented, which can provide a smaller size sealed connector and having a lower cross-talk layout for the respective trace routings.

Sealed Electrical Feed-Through Connector Installation Arrangement

Figure 16A:
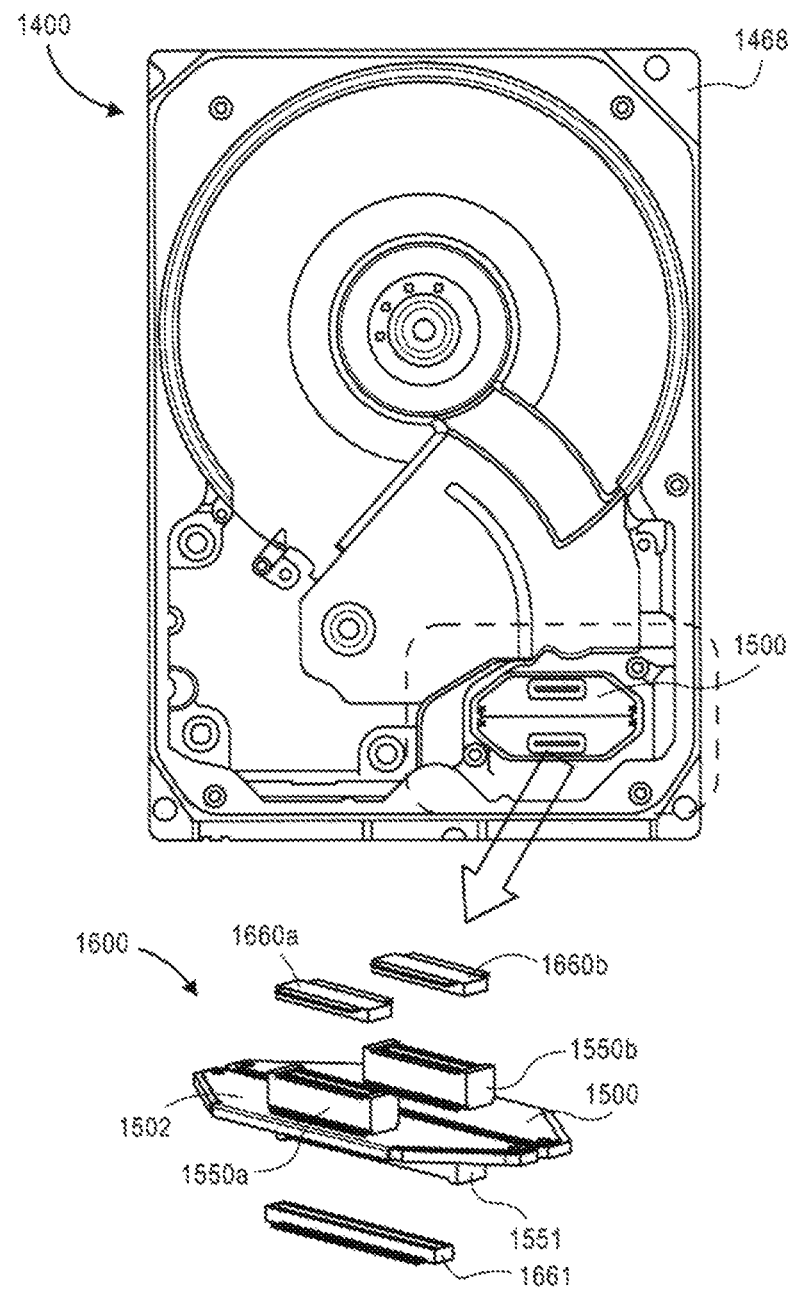
FIG. 16A is an exploded perspective view illustrating a board-to-board flexible type electrical feed-through connector assembly and a plan view of an installation location in a hard disk drive enclosure base, according to an embodiment.
Figure 16B:
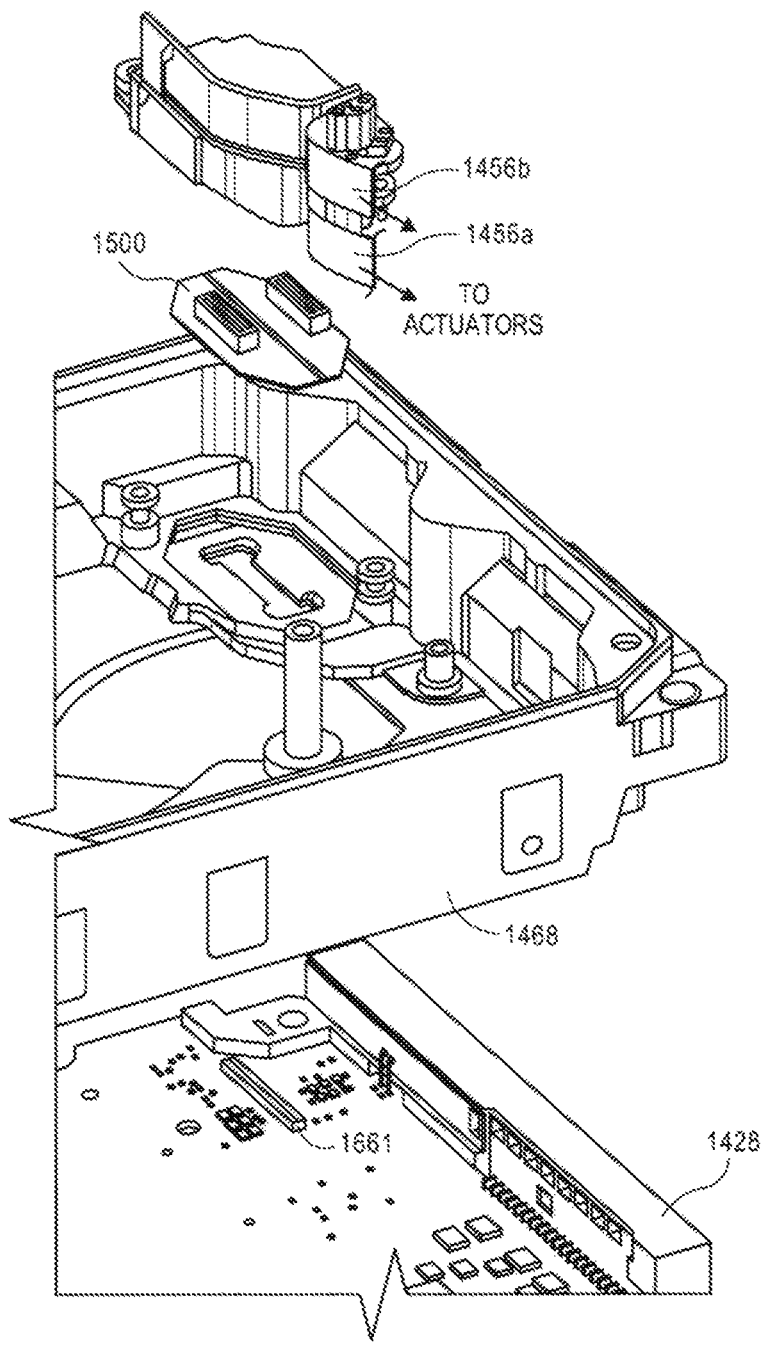
FIG. 16B is a partial exploded perspective view illustrating the board-to-board flexible type electrical feed-through connector assembly of FIG. 16A and associated components, according to an embodiment.

FIG. 16A is an exploded perspective view illustrating a board-to-board flexible type electrical feed-through connector assembly and a plan view of an installation location in a hard disk drive enclosure base, and FIG. 16B is a partial exploded perspective view illustrating the board-to-board flexible type electrical feed-through connector assembly of FIG. 16A and associated components, both according to embodiments. The upper plan view of FIG. 16A illustrates a typical location within an HDD, such as multi-actuator HDD 1400, at which an electrical feed-through assembly such as BTB flex feed-through connector 1500 may be installed. According to embodiments, the BTB flex feed-through connector 1500 may be adhered or otherwise bonded to an internal surface of the HDD 1400 enclosure base 1468 or, alternatively, to an external surface of the base 1468.

Regardless of installation, the lower exploded view of FIG. 16A illustrates the BTB flex feed-through connector 1500 (see FIG. 15) along with corresponding mating connector parts, collectively referenced as BTB flex feedthrough connector assembly 1600. FIG. 16A further depicts an exploded view of (a) a first mating BTB connector part 1660a (e.g., a connector plug or header), which would be electrically connected to a separate component (e.g., an FCA internal to a sealed electronic component, such as first FCA 1456a of FIGS. 14, 16B), and which is configured to mate with and electrically connect to the corresponding BTB part 1550a (e.g., a connector receptacle), and (b) a second mating BTB connector part 1660b (e.g., a connector plug or header), which would be electrically connected to a separate component (e.g., an FCA internal to the sealed electronic component, such as second FCA 1456b of FIGS. 14, 16B), and which is configured to mate with and electrically connect to the corresponding BTB part 1550b (e.g., a connector receptacle). Similarly, FIG. 16A further depicts an exploded view of a third mating BTB connector part 1661 (e.g., a connector plug or header), which would be electrically connected to a separate component (e.g., a PCBA such as PCBA 1428 of FIGS. 14, 16B) external to the sealed electronic component, and which is configured to mate with and electrically connect with the corresponding BTB part 1551 (e.g., a connector receptacle). According to alternative embodiments, the arrangement is reversed, whereby one or more of the BTB connector parts 1660a, 1660b, 1661 (e.g., connector plug or header) may be coupled to the FCA 1502, with corresponding BTB connector parts 1550a, 1550b, 1551 (e.g., connector receptacles) coupled to the other connected components (e.g., FCA 1456a, 1456b and/or PCBA 1428, respectively).

Figure 16C:
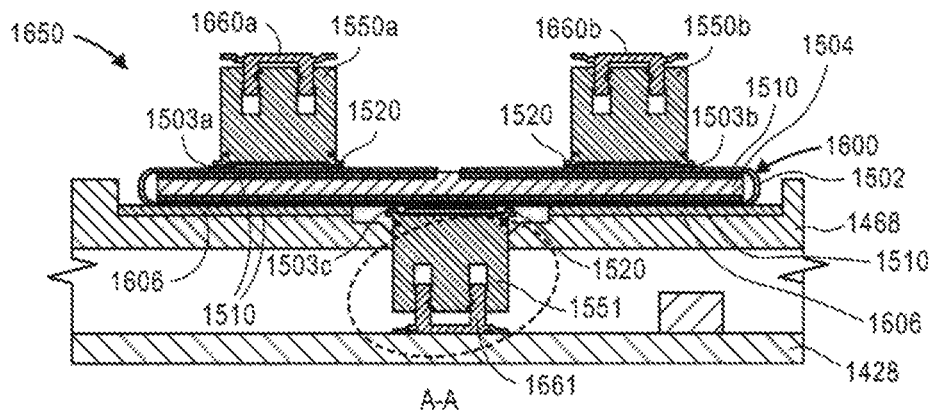
FIG. 16C is a cross-sectional side view illustrating the board-to-board flexible type electrical feed-through connector assembly of FIG. 16A, according to an installation embodiment.

FIG. 16C is a cross-sectional side view illustrating the board-to-board flexible type electrical feed-through connector assembly of FIG. 16A (i.e., BTB flex feed-through connector assembly 1600), according to an installation embodiment. FIG. 16C illustrates and reiterates that the BTB flex feed-through connector assembly 1600 comprises the FCA 1502 (with the laminate layers not demarcated here) wrapped around the metal part 1504, with the two parts coupled together with an adhesive 1510 such as an adhesive film. FIG. 16C further illustrates each BTB connector part 1550a, 1550b, 1551 electrically connected to the FCA 1502 by way of the terminals 1520 or leads of the BTB connector part 1550a, 1550b, 1551 and the pads 1503a, 1503b, 1503c of the FCA 1502, such as with solder, for a non-limiting example.

Installation 1650 comprises the BTB flex feed-through connector assembly 1600 adhered to, bonded to, sealed with, at an interface area (e.g., interface 1450 of FIG. 14) of the enclosure base 1468 by adhesive 1606. FIG. 16C further illustrates the BTB connector part 1660a (e.g., a connector plug or header) which would be coupled to an FCA such as FCA 1456a and the BTB connector part 1660b (e.g., a connector plug or header) which would be coupled to an FCA such as FCA 1456b, and intended for mechanically mating with and electrically connecting to the BTB connector part 1550a and 1550b, respectively, of the BTB flex feed-through connector 1500. Similarly, a BTB connector part 1661 is shown coupled to a PCBA 1428 to form a higher-level PCBA component, intended for mechanically mating with and electrically connecting to the BTB connector part 1551 of BTB flex feed-through connector 1500. Instead of utilizing a BTB connector for coupling to an FCA such as FCA 1456a, 1456b to form a higher-level component, according to an embodiment the installation may utilize a board-to-flex (BTF) connector for electrically connecting a BTF connector receptacle with a BTF connecter flex, such as at a terminal end of an FCA 1456a, 1456b. Note that the base 1468 window through which the BTB connector part 1551 extends at the interface can serve as a guide hole to align the BTB flex feed-through connector 1500. Furthermore, the stepped structural configuration of the base 1468 around the window through which the BTB connector part 1551 extends functions to inhibit or prevent an electrical short among the BTB connector part 1551 and the adhesive 1606, in the scenario in which an electrically conductive adhesive is used. Also notable is that each BTB connector part housing may be fabricated with a low permeability (e.g., to He or other lighter-than-air gas) material.

Floating Board-to-Board Flex Connector

Figure 16D:
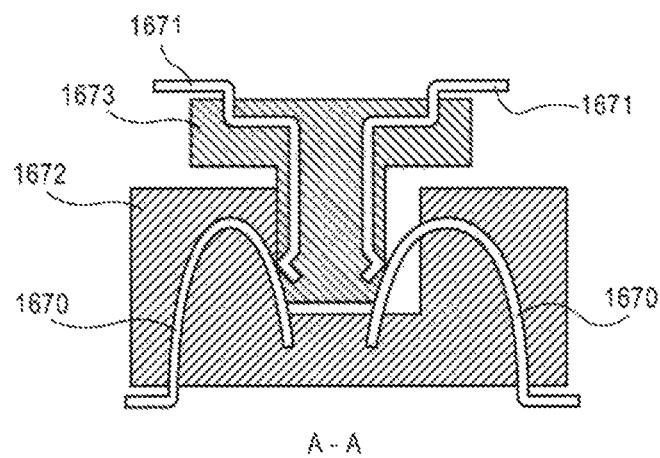
FIG. 16D is a cross-sectional side schematic diagram illustrating a floating board-to-board flexible type connector assembly, according to an embodiment.

Recall that BTB connectors are not tolerant of structural misalignment between connectors (plug and receptacle) where, in the context of an HDD, one side of the connector is on the PCBA and the other side of the connector is attached to the base via the BTB flex feed-through connector. Thus, a tolerance to misalignment of the mating connector parts may be beneficial. FIG. 16D is a cross-sectional side schematic diagram illustrating a floating board-to-board flexible type connector assembly, according to an embodiment. With reference to FIG. 16C, the general area of A-A is magnified in FIG. 16D, showing how a "floating" type of connector part comprises flexible spring-like electrical contact structures 1670 that tolerate misalignment (e.g., from manufacturing accuracy, parts tolerance, and the like), via stress reduction by elastic deformation of the contact structures 1670, between the mating connector parts such as connector part 1672 and connector part 1673. Hence, connector part 1673 has some mechanical alignment tolerance within the connector part 1672, while maintaining sufficient electrical contact between each contact 1671 and its corresponding contact 1670. Furthermore, use of a floating connector can avoid signal deterioration and, in the context of a lighter-than-air gas filled sealed HDD, can reduce gas leakage and enhance reliability by reducing the stress that misalignment may otherwise impose upon the solder pads, adhesive, PCBA leads, flex cables, and the like. Still further, by using a floating connector, parts such as the base and the PCBA do not require as high accuracy production processes and, therefore, parts costs could be lower.

Figure 17:
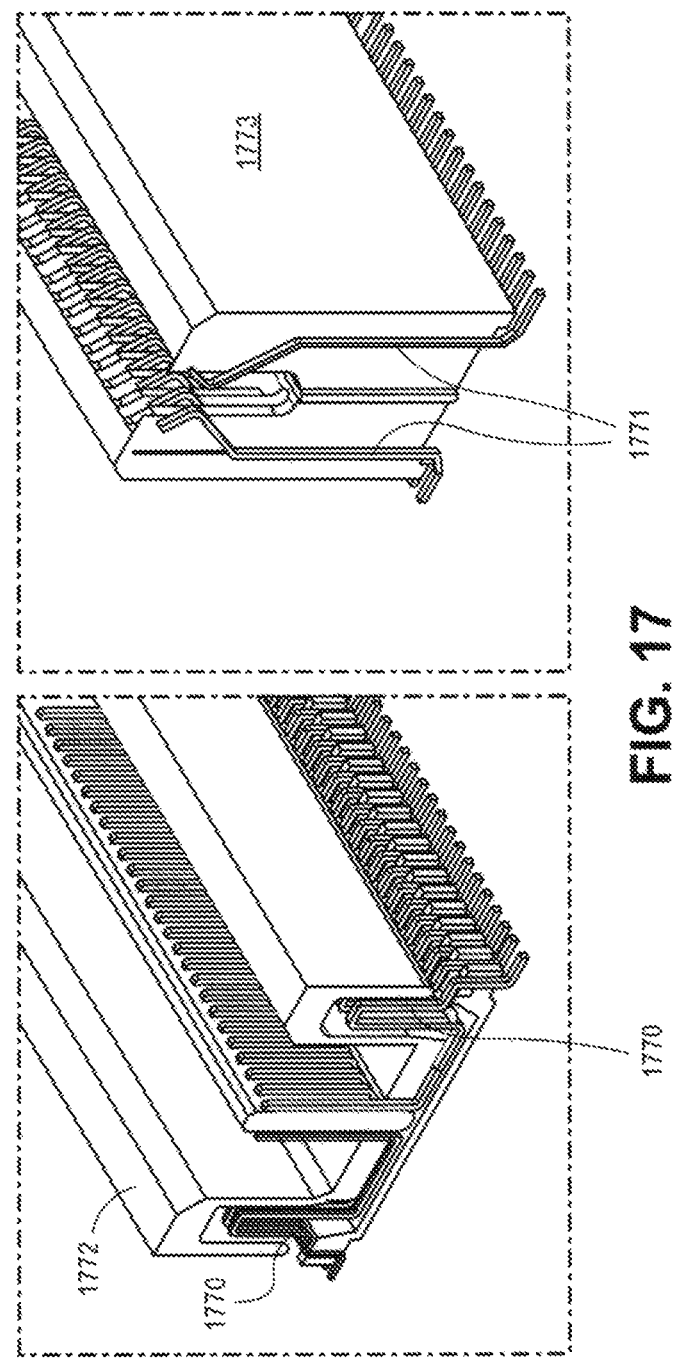
FIG. 17 is partial perspective view illustrating each mating portion of a floating board-to-board flexible type connector assembly, according to an embodiment.

FIG. 17 is partial perspective view illustrating each mating portion of a floating board-to-board flexible type connector assembly, according to an embodiment. A floating connector part 1772 comprises the spring-like electrical contacts 1770 that enable some misalignment between the floating connector part 1772 and the mating floating connector part 1773 by way of the stress reduction by elastic deformation of the contact structures 1770, while maintaining sufficient electrical contact between corresponding contacts 1770 and 1771. Note that floating connector part 1773 would be rotated 180 degrees from the position illustrated in FIG. 17 when mating with floating connector part 1772.

The method of manufacturing an electrical feed-through as described in reference to FIG. 12 may be adapted for use with a BTB flex feed-through connector 1500 (see, e.g., block 1206) by adhering the FCA 1502 to the metal plate 1504, forming a connector assembly comprising the first set 1503a and the second set 1503b of the first pads on the upper side of the connector assembly, electrically connected via the conductors to the second pads 1503c (FIG. 16C) on the lower side of the connector assembly, and then electrically connecting first and second board-to-component connector parts to the first and second sets of first pads, respectively, and a board-to-board connector part to the second pads.

The method of sealing a hermetic interface as described in reference to FIG. 13 may be adapted for use with a BTB flex feed-through connector 1500 by optionally eliminating block 1304, and prior to block 1306, providing first, second, and third electrical connection means between respective portions of the electrical transmission means located either in the hermetically-sealed environment or the external environment and a component located in the respective environment.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A hermetically-sealed data storage device, comprising:
an enclosure base;
a plurality of recording disk media rotatably mounted on a spindle;
a first head slider comprising a read-write transducer configured to read from and to write to one disk media of the plurality of disk media;
a first rotary actuator configured to move the first head slider to access portions of the one disk media;
a second head slider comprising a read-write transducer configured to read from and to write to another disk media of the plurality of disk media;
a second rotary actuator configured to move the second head slider to access portions of the another disk media;
an electrical feed-through connector bonded to the base, the feed-through connector comprising:
a flexible circuit assembly comprising a laminate of a base insulating layer, a conductor layer over the insulating layer, and a cover insulating layer over the conductor layer, wherein the conductor layer comprises a plurality of electrical connection pads and electrical conductors connecting pairs of the pads,
a metal part enveloped at least in part by and adhered to the flexible circuit assembly, forming a connector assembly comprising first pads of the pairs on one side of the connector assembly electrically connected via the conductors to second pads of the pairs on the opposing side of the connector assembly,
a first connector part electrically connected to a first portion of the first pads, and
a second connector part electrically connected to a second portion of the first pads;
a first flexible cable assembly (FCA) electrically connecting the first rotary actuator with the first connector part; and
a second flexible cable assembly (FCA) electrically connecting the second rotary actuator with the second connector part.

2. The data storage device of claim 1, wherein each of the first and the second connector parts is a board-to-board (BTB) connector receptacle.

3. The data storage device of claim 2, wherein:
the first FCA is electrically connected to the first connector part through a first connector plug; and
the second FCA is electrically connected to the second connector part through a second connector plug.

4. The data storage device of claim 1, wherein each of the first and the second connector parts is a board-to-flex (BTF) connector receptacle.

5. The data storage device of claim 1, wherein the first pads comprise a first set of pads and a second set of pads, and wherein each set of pads is positioned near a respective end of the laminate of the flexible circuit assembly.

6. The data storage device of claim 1,
wherein the feed-through connector further comprises a third connector part electrically connected to the second pads;
the data storage device further comprising:
a printed circuit board assembly (PCBA) comprising a printed circuit board (PCB) and a fourth connector part coupled with the PCB and electrically connecting the PCB with the third connector part.

7. The data storage device of claim 6, wherein each of the third and fourth connector parts is a board-to-board (BTB) connector part.

8. The data storage device of claim 7, wherein the fourth connector part of the PCBA is a floating board-to-board (BTB) connector part comprising flexible spring-like electrical contact structures that tolerate misalignment, by deformation, between the third connector part and the fourth connector part.

9. The data storage device of claim 8, wherein the electrical feed-through connector is bonded to the inside of the base.

10. The data storage device of claim 8, wherein the electrical feed-through connector is bonded to the outside of the base.

11. An electrical feed-through configured to interface between a hermetically-sealed environment and an external environment, the feed-through comprising:
a flexible printed circuit (FPC) part comprising a base insulating layer, a conductor layer over the insulating layer, and a cover insulating layer over the conductor layer, wherein the conductor layer comprises a plurality of electrical connection pads and electrical conductors connecting pairs of the pads;
a metal plate at least in part around which the FPC is wrapped and to which the FPC is adhered, forming a connector assembly comprising first pads of the pairs on an upper side of the connector assembly electrically connected via the conductors to second pads of the pairs on the lower side of the connector assembly;
a first board-to-component connector part electrically connected to a first set of the first pads;

a second board-to-component connector part electrically connected to a second set of the first pads; and a third board-to-board (BTB) connector part electrically connected to the second pads.

12. The electrical feed-through of claim 11, wherein each of the first and the second board-to-component connector parts is a board-to-flex (BTF) connector.

13. The electrical feed-through of claim 11, wherein each of the first and the second board-to-component connector parts is a board-to-board (BTB) connector.

14. The electrical feed-through of claim 11, wherein the third BTB connector part is a floating BTB connector part comprising flexible spring-like electrical contact structures that tolerate misalignment, by deformation, between a mating connector part and the floating BTB connector part.

15. The electrical feed-through of claim 11, wherein each of the first set and the second set of the first pads is positioned near a respective end of the FPC part.

16. A hard disk drive comprising the electrical feed-through of claim 11.

17. A method of manufacturing an electrical feed-through component, the method comprising:

forming a laminate flexible cable assembly (FCA) comprising a base insulating layer, a conductor layer over the insulating layer, and a cover insulating layer over the conductor layer, wherein the conductor layer comprises a plurality of electrical connection pads and electrical conductors connecting pairs of the pads;

folding the FCA at least in part around a metal plate;

adhering the FCA to the metal plate, forming a connector assembly comprising a first set and a second set of first pads of the pairs on an upper side of the connector assembly electrically connected via the conductors to second pads of the pairs on the lower side of the connector assembly;

electrically connecting a first board-to-component connector part to the first set of first pads;

electrically connecting a second board-to-component connector part to the second set of first pads; and electrically connecting a board-to-board (BTB) connector part to the second pads.

18. The method of claim 17, wherein electrically connecting the first and the second board-to-component connector parts includes electrically connecting first and second BTB connector receptacles.

19. The method of claim 17, wherein electrically connecting the first and the second board-to-component connector parts includes electrically connecting first and second board-to-flex (BTF) connector receptacles.

20. The method of claim 17, wherein electrically connecting the board-to-board connector part includes electrically connecting a floating board-to-board (BTB) connector part to the second pads, wherein the floating BTB connector part comprises flexible spring-like electrical contact structures that tolerate misalignment, by deformation, between a mating connector part and the floating BTB connector part.

21. A method of sealing an interface between a hermetically-sealed environment of an electronic component and an external environment, the method comprising:

providing electrical transmission means for transmitting electrical signals through the interface;

providing first electrical connection means between a first portion of the electrical transmission means located in the hermetically-sealed environment and a component located in the hermetically-sealed environment;

providing second electrical connection means between a second portion of the electrical transmission means located in the hermetically-sealed environment and a component located in the hermetically-sealed environment;

providing electrical connection means between a portion of the electrical transmission means located in the external environment and a component located in the external environment; and providing hermetically-sealing means for bonding the electrical transmission means with an enclosure base of the electronic component.

* * * * *